(12) United States Patent
Floresca et al.

(10) Patent No.: US 11,508,549 B2
(45) Date of Patent: Nov. 22, 2022

(54) PARTICLE BEAM PROFILES FOR ANALYTIC EQUIPMENT CONFIGURATION

(71) Applicant: FEI Company, Hillsboro, OR (US)

(72) Inventors: Herman Carlo Floresca, Frisco, TX (US); Brian Tilley, Richardson, TX (US)

(73) Assignee: FEI Company, Hillsboro, OR (US)

( * ) Notice: Subject to any disclaimer, the term of this patent is extended or adjusted under 35 U.S.C. 154(b) by 566 days.

(21) Appl. No.: 16/664,661

(22) Filed: Oct. 25, 2019

(65) Prior Publication Data

US 2021/0125808 A1 Apr. 29, 2021

(51) Int. Cl.
*H01J 37/252* (2006.01)
*H01J 37/30* (2006.01)
*H01J 37/153* (2006.01)
*H01J 37/28* (2006.01)

(52) U.S. Cl.
CPC .......... *H01J 37/252* (2013.01); *H01J 37/153* (2013.01); *H01J 37/28* (2013.01); *H01J 37/30* (2013.01); *H01J 2237/1532* (2013.01); *H01J 2237/24542* (2013.01); *H01J 2237/24564* (2013.01)

(58) Field of Classification Search
CPC ......... H01J 37/252; H01J 37/153; H01J 37/28
See application file for complete search history.

(56) References Cited

U.S. PATENT DOCUMENTS

2022/0050389 A1* 2/2022 Jäckel ................ G03F 7/70733

* cited by examiner

*Primary Examiner* — Joseph L Williams
(74) *Attorney, Agent, or Firm* — Klarquist Sparkman, LLP

(57) ABSTRACT

Beam intercept profiles are measured as a particle beam transversely scans across a probe. A current of beam particles, a detector intensity, or image pixel intensities can variously be measured to obtain the profiles. Multiple profiles are used to determine geometric parameters which in turn can be used to configure equipment. In one application, transverse beam intercept profiles are measured for different waist heights of the particle beam. Steepness of the several profiles can be used to determine a height of the probe as the height at which the profile is steepest. The known probe height enables placing the probe in contact with a substrate at another known height. In another application, transverse beam intercept profiles of orthogonal probe edges are used to position a beam waist, reduce spot size, or reduce astigmatism. Techniques are applicable to SEM, FIB, and nanoprobe systems. Methods and apparatus are disclosed, with variations.

27 Claims, 11 Drawing Sheets

PARTICLE BEAM PROFILES FOR ANALYTIC EQUIPMENT CONFIGURATION

FIELD

The disclosure pertains to particle current beam profiles, and applications including configuration of analytic equipment.

BACKGROUND

Existing techniques for configuring analytic equipment such as scanning electron microscope (SEM) instruments, focused ion beam (FIB) instruments, and nanoprobe instruments often involve 2-D images and human assessments, and can be time-consuming and error-prone. Accordingly, there remains a need for improved technology to configure analytic instruments.

SUMMARY

Apparatus and methods are disclosed for collecting beam current profiles over a transverse scan in a particle beam machine, and applying one or more such scans to evaluate geometric parameters which can be used in multiple ways for automatic configuration of the particle beam machine or associated equipment.

In a first aspect, the disclosed technologies can be implemented as an apparatus incorporating a particle beam source configured to emit a particle beam, computer-readable media storing instructions, and one or more hardware processors with coupled memory. The hardware processors are also coupled to the particle beam source and the computer-readable media. When executed by the one or more hardware processors, the instructions cause the hardware processors to perform operations including obtaining a plurality of transverse profiles of particle beam intensity and evaluating the transverse profiles to establish a geometric characteristic. The transverse profiles are obtained at one or more longitudinal positions of a waist of the particle beam.

In some examples, a transverse profile can be obtained by measuring current of the particle beam intercepted by a current collector at a plurality of points of a transverse scan: the particle beam can be scanned across the current collector, or the current collector can be scanned across the particle beam. In further examples, a transverse profile can be obtained by measuring intensities of secondary or backscattered particles at a plurality of points of a transverse scan of the particle beam and a probe, relative to one another. In additional examples, a transverse profile can be obtained by determining pixel intensities, with an imaging subsystem, along a transverse scan of the particle beam relative to a probe.

In certain examples, establishing the geometric characteristic can be determining a longitudinal coordinate of a probe. The probe can be a nanoprobe, and the apparatus can include an actuator coupled to the nanoprobe. The operations can include determining a longitudinal translation of the nanoprobe based on a difference between the longitudinal coordinate of the nanoprobe and a longitudinal coordinate of a substrate surface. Based on the longitudinal translation, the actuator can be controlled to place the nanoprobe in contact with the substrate surface.

In further examples, establishing the geometric characteristic can be setting a longitudinal coordinate of the waist of the particle beam. First and second transverse profiles can include respectively transverse scan points of the particle beam relative to first and second probe edges. The first and second probe edges can have orthogonal transverse projections. The first and second transverse profiles can be obtained in a single transverse scan. The scan speed of the single transverse scan can be faster when the particle beam is at one of the two probe edges and slower when the particle beam is between the two probe edges. In additional examples, the operations can include executing a control adjustment on the particle beam to reduce an astigmatism or a waist size of the particle beam.

In various examples, the apparatus can be a scanning electron microscope, the particle beam can be a focused ion beam, or the current collector can be a nanoprobe.

In another aspect, the disclosed technologies can be implemented as a method. Multiple transverse beam intercept profiles are obtained for respective longitudinal positions of a waist of a particle beam. Each of the transverse beam intercept profiles is obtained with a probe at least partly intercepting the particle beam. The transverse beam intercept profiles are evaluated to determine a longitudinal coordinate of the probe.

In certain examples, a transverse beam intercept profile can be obtained by measuring current of the particle beam intercepted by the probe at a plurality of points of a transverse scan of the particle beam relative to the probe. Evaluation can include determining an indicator of steepness for each of the transverse beam intercept profiles, and thereby determining a first longitudinal coordinate of the waist of the particle beam, at which the steepness is a maximum. In some examples, the first longitudinal coordinate of the waist can be determined by fitting a measure of the steepness as a function of the longitudinal position of the waist of the beam. In other examples, the first longitudinal coordinate of the waist can be determined by iterating the longitudinal positions of the waist of the particle beam until a convergence criterion is met. The longitudinal coordinate of the probe can be determined based on the first longitudinal coordinate of the waist. The method can include determining an amount of longitudinal translation for the probe, from a difference between the longitudinal coordinate of the probe and a longitudinal coordinate of a substrate surface. The probe can be directly or indirectly be longitudinally translated by the determined amount.

In further examples, the abovementioned transverse beam intercept profiles can be obtained after tuning a cross-sectional pattern of the particle beam. The tuning can be performed based on other transverse beam intercept profiles.

In additional examples, the particle beam can be an electron beam of a scanning electron microscope; and the probe can be a nanoprobe. A transverse beam intercept profile can be obtained by measuring current of the particle beam intercepted by the probe at a plurality of points of a transverse scan of the particle beam relative to the probe. The transverse beam intercept profile can correspond to a portion of the particle beam intercepted by the probe as a function of a transverse coordinate. Evaluation of the transverse beam intercept profiles can include determining an indicator of steepness for each of the transverse beam intercept profiles, determining a first longitudinal coordinate of the waist of the particle beam at which the steepness is a maximum, and determining the longitudinal coordinate of the probe based on the first longitudinal coordinate of the waist. The method can be implemented by a computer-readable storage media storing instructions which can be executed by one or more hardware computer processors.

In another aspect, the disclosed technologies can be implemented as a method. Multiple transverse beam intercept profiles are obtained for respective having distinct orientations. Each of the profiles is obtained with the respective probe edge at least partly intercepting a particle beam. The transverse beam intercept profiles are evaluated to set one or more geometric parameters of the particle beam.

In some examples, a transverse beam intercept profile can be obtained by measuring current of the particle beam intercepted by a given one of the probe edges at a plurality of positions of a transverse scan of the particle beam relative to the given probe edge. The geometric parameters can include a longitudinal coordinate of a waist of the particle beam. The longitudinal coordinate of the waist can be set to a longitudinal coordinate of a transverse plane in which the probe edges are situated. The method can include adjusting one or more astigmatism controls to reduce the waist of the particle beam.

In additional examples, two of the probe edges can have orthogonal transverse projections. Evaluation of the transverse beam intercept profile can include identifying first and second values of a focus control of the particle beam at which the transverse beam intercept profiles of the two probe edges are complementary.

In certain examples, the particle beam can be an electron beam of a scanning electron microscope and can have a waist. The two probe edges can be edges of one or more nanoprobes. A transverse beam intercept profile can be obtained by measuring current of the particle beam intercepted by a given one of the two probe edges at multiple positions of a transverse scan of the particle beam relative to the given probe edge. The multiple positions can be situated on a straight line. Geometric parameters including a longitudinal coordinate of the waist and a diameter of the waist can be set. The method can further include determining a central value between the first and second values of the focus control, setting the focus control to the central value, thereby setting the longitudinal coordinate of the waist at a transverse plane of the two probe edges by. Settings of one or more astigmatism controls of the particle beam can be iterated to minimize the diameter of the waist. The method can be implemented by a computer-readable storage media storing instructions which can be executed by one or more hardware computer processors.

The foregoing and other features and advantages of the disclosed technologies will become more apparent from the following detailed description, which proceeds with reference to the accompanying figures.

DETAILED DESCRIPTION

Introduction

Figure 1A:
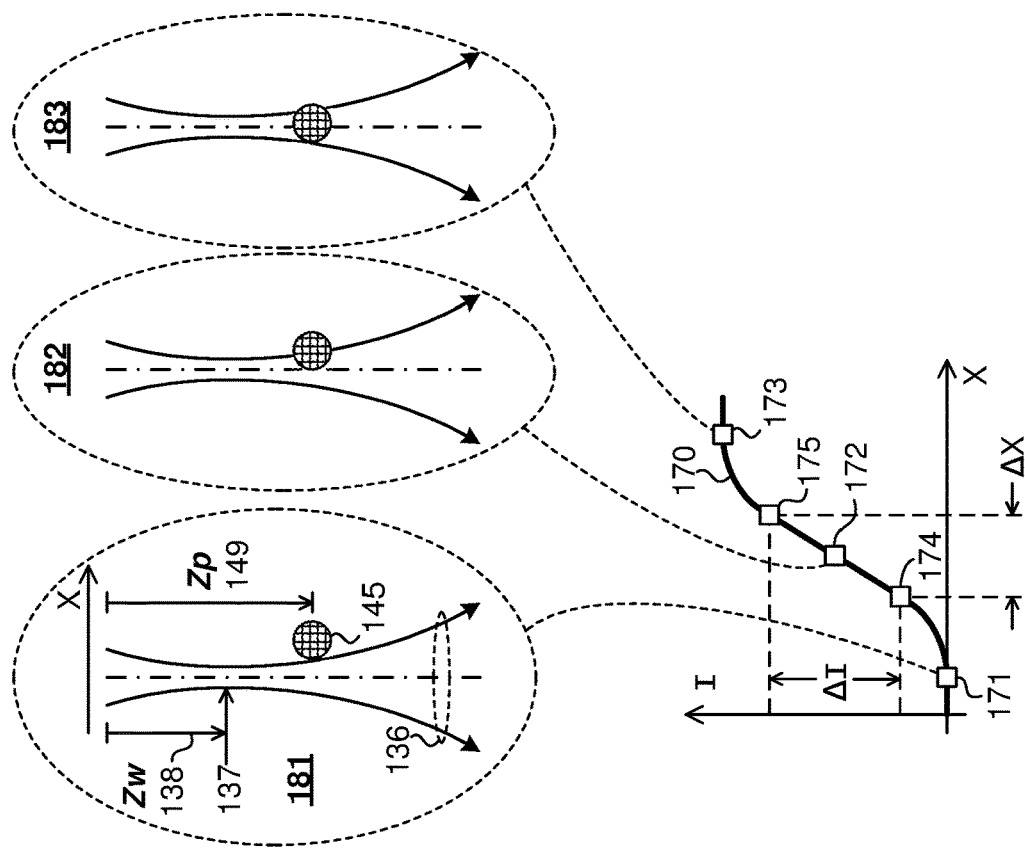
FIGS. 1A-1B are diagrams illustrating an application of the disclosed technology.

SEM, FIB, nanoprobe, and other forms of analytic equipment can use particle beams along with probes or other apparatus. Conventional configuration of such equipment often involves procedures that can be slow or prone to error, for example acquiring a 2-D raster scanned image, or relying on human interpretation of such an image. Such procedures can prevent implementation of rapid, consistent, reproducible, or automated analytic workflows, which can be of particular concern in a production environment.

Examples of the disclosed technologies can apply geometric properties of particle beams or probes to make an automated determination of other geometric parameters, which in turn can be used for automated configuration of analytic equipment.

As an example, nanoprobe systems can offer precise relative motion of a nanoprobe, but can have difficulty accurately assessing an absolute position of the nanoprobe, in particular, the height of the nanoprobe above a substrate surface. With the disclosed technologies, the height of a nanoprobe can be determined and used to accurately set the nanoprobe down on a substrate surface.

Existing particle beam controllers can have a capability to create a focused beam, with the ability to control and monitor the working distance. A focused beam can have a waist at which the cross-sectional spot size is minimum, with increasing spot sizes at locations longitudinally displaced from the waist in either direction. Thus, scanning a current measuring probe through the beam waist can result in a steeper profile of measured intercepted beam current, as compared to scans through other cross-sections of the beam. The disclosed technology applies this property by acquiring transverse beam intercept profiles at several working distances (longitudinal coordinates) of the beam waist. A longitudinal coordinate L0 of the waist, at which the transverse beam intercept profile is steepest, indicates that the probe also has a longitudinal coordinate L0. In an example, L0 was determined with an accuracy within 1 μm.

In examples, this technique can be performed with 3-20 transverse scans at different working distances, which can be obtained significantly faster than hundreds or even a thousand scan lines in a typical 2-D raster scan image. Because this technique can be automated, it can be fast and consistent. Moreover, this technique does not rely on focused images, and can be used when the nanoprobe is fairly close to the substrate surface, a condition which can be particularly challenging with a conventional image-based approach.

As another example, particle beam machines commonly require tuning of the beam to obtain a good quality beam, e.g., having a narrow waist and low or zero astigmatism. Conventional approaches can involve evaluation of images or human assessment, which can be slow or error-prone. With the disclosed technologies, single line scans across two probe edges can be used to assess characteristics of a beam's focus or astigmatism on the basis of which automated beam tuning can be performed, as described herein.

Such a technique, using a single line scan or a few line scans, can offer a significant saving over 884 scan lines in a typical image format. The technique can be widely applied to a variety of particle beam equipment.

The disclosed technologies can provide valuable improvements to automated workflow for particle beam based analytic equipment.

Terminology

The usage and meaning of all quoted terms in this section applies throughout this disclosure unless clearly indicated otherwise or repugnant to the context. The terminology below extends to related word forms.

The term "actuator" refers to a mechanical device for moving another object. Some actuators can be classified as rotary or linear actuators. Actuators often take one form of energy (e.g., electrical energy) and convert it into mechanical energy. Some actuators that can be used with the disclosed technology are piezoelectric actuators.

The term "ammeter" refers to a measurement device that can measure electrical current. An ammeter can be embodied as a stand-alone device, as part of an electronics package, or even within a same integrated circuit package (e.g., system on a chip (SoC)) as a microprocessor or other computer processors. An electronic ammeter can include e.g., a resistor coupled to a voltage-sensing analog-to-digital converter (ADC), a current-sensing ADC, or another implementation. An ammeter can have multiple inputs which can be measured separately (e.g., a four-channel ammeter) or together (e.g., so-called wired-OR configuration). Accordingly, a group of distinct ammeters is also considered to be an ammeter.

The term "astigmatism" refers to the deviation from circularity of a beam cross-section. In simple examples, a non-circular beam cross-section can be characterized as an ellipse having a major axis ("a", longest distance across the beam), a minor axis ("b", shortest distance across the beam), and an orientation of the major axis relative to some reference direction such as an X axis. The eccentricity of the ellipse is $e=\sqrt{1-b^2/a^2}$. The astigmatism can be characterized by eccentricity and orientation, or other equivalent parameters. Astigmatism of a beam can vary with longitudinal position.

The term "beam" refers to a directional flow of particles or energy. Common beams of interest in this disclosure are electron beams or ion beams, but the term is not limited thereto. A beam can have finite extent transverse to its principal longitudinal direction of flow. A line joining the centroids of two or more transverse cross-sections of a beam is an "axis" of the beam. Some beams can be well-confined. Other beams can have tails, with transverse extent beyond the bulk of the beam's particles or energy. Accordingly, a beam or any cross-section of the beam can have a "boundary" which can be defined as a smallest perimeter or surface containing some fraction of the beam's particles or energy, such as 90%, 99%, 100%, or some other fraction. The dimensions of the beam (such as diameter, area) or related quantities such as eccentricity or astigmatism can be defined with respect to the boundary. A beam can have a uniform or non-uniform density distribution across its cross-section. Such a distribution is called a "pattern" of the beam. Some beams of interest can have or can be approximated by a Gaussian pattern. A beam can have a waist.

Terms such as "best," "lowest," "minimum," "optimize," or the like are used to indicate that a selection among a few or among many alternatives can be made, and such selections need not be better, lower, less, or otherwise preferable to other alternatives not considered.

A "coordinate" is a number, optionally with a unit, that indicates a position or orientation of a point or object in space. Common coordinates can be linear (e.g., longitudinal coordinate in the direction of a beam axis) or angular (e.g., an angle in cylindrical coordinates).

The term "current" refers to electrical current for charged particle beams, but can also refer to equivalent electrical current for, e.g., neutral or optical beams, either of which can, under suitable conditions, generate electrical current in a target material through a process such as ionization or the photoelectric effect. "Intercepted current" refers to the current measured by an ammeter coupled to an object such as a probe inserted at least partly within a beam to intercept at least a portion of the beam. In some examples, intercept current can equivalently be determined by subtracting substrate current from the total beam current. That is, a measurement of beam current intercepted by a probe need not measure the current directly from the probe. Other proxies for intercepted beam current can also be used, for example detected intensity of secondary or backscatter particles from a probe or from a substrate, or pixel intensity obtained in an imaging system from such detected secondary or backscattered particles. Any of these, or another physical phenomenon, can serve as an indicator of intensity of a particle beam.

The term "current collector" refers to any object which can be inserted at least partly within a beam to produce a current.

The term "dwell" refers to an operation of stopping or moving slowly at part of a scan or cycle relative to other parts of the scan or cycle. The term "dwell time" can refer to the amount of time to perform a portion of a scan, which can be a single current measurement at a particular coordinate position, or which can be a succession of measurements to gather a single intercept profile of one probe edge, in a scan over multiple probe edges. In contrast, "transit time" can refer to the amount of time taken to move the beam or probe from one measurement point to a next measurement point, or from one portion of a scan (e.g., over a first probe edge) to another portion of the same scan (e.g., over a second probe edge).

The term "establish" refers to forming a correspondence between a variable quantity and a value. In some examples, the correspondence can be formed by determining a present value of the variable quantity. In other examples, the correspondence can be formed by adjusting the variable quantity to have a target value.

The term "focus" refers to a position in a beam at which an image has best resolution (which can be the same as the waist of the beam), or refers to a property of an image having been formed at the focus of a beam. A focus can be zero-dimensional (a point), one-dimensional (a curve or line), or two-dimensional (a surface or plane).

The term "focused ion beam" (FIB) refers to a beam of ions whose focus can be controlled to, for example: focus at a spot on a surface, have a focused waist at another longitudinal coordinate, or scan over a scan pattern. A FIB can be used for analysis, deposition, or removal of material at the focus spot. Commonly, a FIB comprises positive elemental ions, such as Xe+ or Ga+, however these are not requirements. Ion beam species such as Ga+ can be sourced from e.g., a liquid metal ion source (LMIS), while other ion beam species such as Xe+ can be produced in a plasma. A FIB produced with a plasma source can be termed a plasma focused ion beam (PFIB). Commonly, a FIB can be directed onto a surface for an analysis, deposition, imaging, or removal procedure.

The term "geometric characteristic" refers to any property or parameter of a physical object, apparatus, or system, which can be measured in units of length, as a spatial angle, or as a function of only such quantities (including areas and volumes). Some geometric characteristics of interest in this disclosure include waist size of a beam, astigmatism of a beam (including eccentricity and orientation), longitudinal coordinate of a probe, cross-sectional area of a beam, or longitudinal coordinate of a beam waist.

The term "intercept" refers to absorbing or redirecting a portion (or all) of a beam. For example, a current collector placed partway into an electron beam can intercept some percentage of the beam and route the intercepted current to an ammeter for measurement.

The term "iteration" refers to each of multiple times a given operation or sequence of operations is performed. A sequence of iterations is dubbed a "loop." Iterations can be classified as "identical" if parameters are left unchanged between iterations (identical iterations can be used, for example, to improve signal quality through averaging), "predetermined" if the parameter values over which operations are to be repeated are known before the first iteration is performed, or "guided" if a parameter value of a later iteration depends on a result of an earlier iteration. Predetermined iterations refer to iterations actually performed. A loop of predetermined iterations need not execute for all the predetermined parameter values, but can terminate or exit early if a termination condition is met. A loop of guided iterations can begin with one or more predetermined iterations as seed(s).

The terms "longitudinal" and "transverse" generally describe coordinates of the described examples. Longitudinal refers to a direction along an axis of a beam, an axis of a beam source, or an axis of an instrument. Positions along the longitudinal direction can be described as height (measured above a substrate), longitudinal coordinate, Z coordinate, working distance (the distance from an emitting aperture or plane of a beam source to the waist or focus of the beam), or simply longitudinal position.

The term "nanoprobe" refers to an electrical probe suitable for investigating microelectronic devices with feature size under 1 µm and often under 100 nm. In some examples, nanoprobes can be deployed with SEM, FIB, or atomic force microscopy (AFM) systems to assist in registration between nanoprobe and substrate features. Nanoprobes can commonly be arranged in an array of two to eight nanoprobes. In some examples, a nanoprobe can have a tip radius of 5 to 35 nm, and a body diameter of about 100 to 500 µm. A nanoprobe can be coupled to instrumentation circuitry to provide stimulus or acquire response signals from a substrate under test. A nanoprobe coupled to an ammeter can be used to acquire beam intercept current profiles in some examples of the disclosed technologies.

The term "orthogonal" refers to two directions, features, or objects that are perpendicular or nearly perpendicular to one another. For features or objects, a direction of major extent can be considered for determination of orthogonality. In examples, two directions can be said to be orthogonal if they are within a defined tolerance of 90°, such as 90°±1°, 90°±2°, 90°±5°, 90°±10°, 90°±20°, or 90°±30°.

The term "particle" refers to a distinct unsubdivided unit of a flow of matter. Particles of common interest in this disclosure include charged particles such as electrons or ions (such as Ga, Xe, or protons), however particles are not limited thereto.

The term "particle beam" refers to a beam comprising a directional flow of particles.

The term "probe" refers to a device used in analytic equipment to apply or receive a signal at a particular position. Probes can be used to investigate a substrate, or to profile a particle beam. Inasmuch as probes in this disclosure can be used to measure beam current, in many cases a probe can serve as a current collector. A probe can have additional functions in analytic equipment, such as a nanoprobe. A current collector need not have any additional functions. A nanoprobe is a particular example of a probe. Additionally, a width of a probe can be 1-2 orders of magnitude bigger than a transverse dimension of a particle beam. Accordingly, in some examples, a transverse beam intercept profile can be complete after only a small portion of a probe has passed into the beam. Therefore, in some instances a probe edge is described herein. The "edge" of a probe or another current collector is a bounding curve of the probe or current collector as viewed in a longitudinal direction defined by a particle beam, and portions of the probe or current collector adjacent to the bounding curve. The edge portion of the probe can have a width extent of 0.1% to 33% of the width of the probe, or often at least the width of a particle beam that is used with the probe. Accordingly, descriptions of a probe herein can similarly be applicable to an edge of a current collector, an edge of a nanoprobe, or an edge of another probe. Relative to a transverse scan, the edges of a probe can be further labeled as "leading edge," which intercepts a portion of a beam first during a transverse scan, and a "trailing edge" which intercepts a portion of the beam last during a transverse scan. The leading edge and the trailing edge can be reversed if a scan direction is changed. The terms "leading edge" and "trailing edge" can be extended to corresponding portions of a beam intercept profile.

The term "profile" refers to a distribution of some quantity as a function of position along a straight or curved line. A common profile of interest in this disclosure is a profile of intercepted current of a particle beam as a function of a transverse coordinate (e.g., X) as a probe or current collector and a beam move with respect to each other in the X direction. Such a profile is referred to as a "transverse beam intercept profile." The particle beam can propagate in a longitudinal direction.

The term "scan" refers to a spatial traversal. Common scans in this disclosure are one-dimensional scans, such as a transverse scan of a probe in an X direction across a particle beam, and often with attendant measurements being performed during the scan, such as measurement of current as the probe traverses the particle beam. However, neither of these are requirements: a scan can be two or more dimensions, and need not involve any measurement. A scan can be continuous, for example with measurements performed continuously as a probe is moved, or discrete, for example with measurements made at a set of discrete, distinct points. Whether a scan is continuous or discrete, the scan can be performed with uniform or variable speed. A scan can be monotonic, for example a scan over multiple points having successively increasing X coordinate values, or not. In some examples, the points of a scan can be traversed back-and-forth, or out-of-order in another sequence. A one-dimensional scan can be performed over a plurality of points or positions that are disposed on a straight line.

The term "scanning electron microscope" (SEM) refers to an instrument combining an electron beam with controls to scan the electron beam in one or more transverse directions to perform imaging or some other analytic function on a substrate. An SEM can be used as a stand-alone imaging instrument, or can be integrated with other analytic equipment, for example in a nanoprobe system.

The term "steepness" refers to a quantitative attribute of a signal or profile: a measure of steepness can be inversely proportional to the distance over which the signal or profile rises or falls. Taking X to be a distance coordinate in a scanning direction, and Q as a signal of interest, example steepness measures can include maximum slope $dQ/dX$, reciprocal of the transition distance $\Delta X$ between two limits such as 10% to 90% of a flat-top or peak value of the signal Q, the average slope $\Delta Q/\Delta X$ over similar limits, or an absolute value of any of these measures. Other measures of steepness can be reciprocals of these quantities, for example, the transition distance $\Delta X$. For the latter case, maximum steepness can be at a minimum value of $\Delta X$. That is, searching for the steepest profile can involve searching for a minimum value of the steepness measure $\Delta X$, as in FIG. 5 herein. Any of these or similar measures can provide an indication of steepness. While $\Delta X$ of a profile can be used as a steepness measure, in other instances $\Delta X$ can be merely a difference between two X coordinates, without reference to steepness.

The term "substrate" refers to a physical object that can subject to an analytic procedure with a beam or probe or other analytic equipment as described in this disclosure. The term "sample" can be used interchangeably. Often, a substrate can have a "major surface" exposed to the beam or probe, which is a surface of the substrate whose area is not substantially exceeded by any other surface of the substrate.

The terms "top," "bottom," "up," "down," and the like are used for convenience, with respect to a common configuration in which a top surface of a sample is processed, e.g., by ion milling, downward to increasing depths. One of ordinary skill will understand from this disclosure that a choice of actual orientation can be varied without departing from the scope of the disclosed technologies.

The term "translation" refers to a change in position of a physical object. Although a translation from coordinates (x1, y1, z1) to (x2, y2, z2) can be performed in a straight line (i.e., as a "linear translation"), there is no requirement to do so unless expressly stated. A translation can be performed in a circular, sinuous, or other path. Similarly, a translation neither requires nor precludes any change in orientation. However, a change in orientation without a change in position is not considered a translation.

The term "transverse" refers to dimensions and positions in any plane perpendicular to a beam axis. A substrate surface can often be oriented to be transverse to the beam, but this is not a requirement. In some examples, the direction along which a transverse scan is performed can be regarded as the X direction without loss of generality. In other examples, scans can be performed in more than one transverse direction. In some examples, the orientation of an edge of a current collector or probe can be regarded as the Y direction, i.e., orthogonal to the transverse scan direction but in the transverse plane, while in other examples such an edge or probe can have a different orientation, such as at 45° from the X direction.

The term "transverse projection" refers to a projection of an object or feature onto a transverse plane. That is, the transverse projection appears as the shadow of the object or feature on the transverse plane when subject to an illumination beam propagating in the longitudinal direction.

A "transverse scan" refers to a scan over a varying transverse coordinate, for example a probe or a beam moved in a transverse direction relative to the other. Measurements at points of a transverse scan can yield a transverse profile.

The term "waist" refers to a longitudinal position in a beam at which the transverse cross-section can fit inside a smaller circle than the transverse cross-section at any other longitudinal position. A beam waist can be characterized by a pattern, a diameter, or a cross-sectional area (sometimes dubbed "spot size"). In a beam having astigmatism, the waist can be similar to the circle of least confusion used in optics.

First Example Application

Figure 1B:
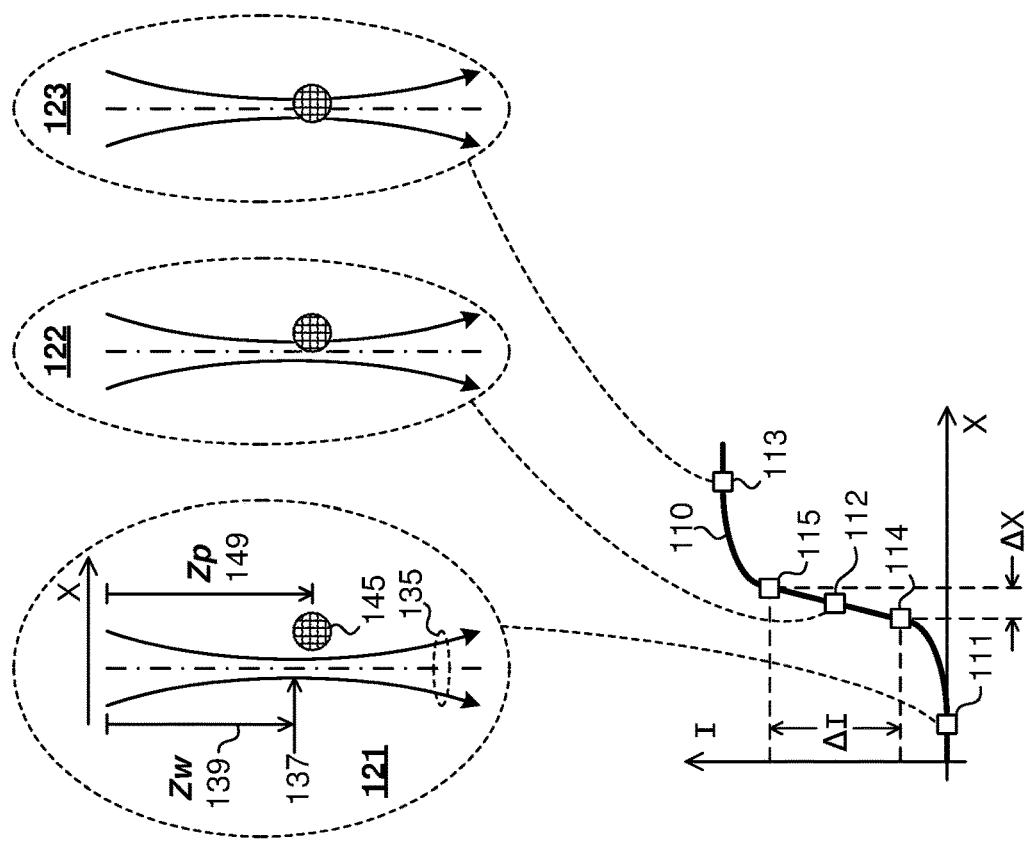

FIGS. 1A-1B are diagrams illustrating an application of the disclosed technology. Each diagram illustrates a transverse beam intercept profile, plotted as a graph of measured probe current I vs. transverse coordinate X, for respective configurations. The transverse coordinate X can be scanned either by sweeping the beam in the X direction or by translating the probe in the X direction.

FIG. 1A illustrates a configuration in which beam waist 137 has a longitudinal coordinate 139 (Zw) close to the longitudinal coordinate 149 (Zp) of probe 145. Graph 110 shows the response of the intercepted beam current I as a function of a transverse coordinate X, with five points 111-115 marked for purpose of illustration. The actual number of points measured for a graph such as 110 can vary, and can be more than five or less than five. The insets 121-123 show the configuration of the probe 145 and the beam 135 for the respective points 111-113. Features common to the insets 121-123 are omitted from the insets 122-123 for clarity of illustration. Coordinate axis X is marked in the inset 121 from the perspective of the beam 135 being scanned with the probe 145 stationary. A typical beam diameter can be in a range from 1 nm to 1 often about 1-2 nm at a beam waist, whereas a typical probe diameter can be in a range from 50-2000 often about 200-500 μm. Accordingly, the insets 121-123, 181-183 of FIGS. 1A-1B are illustrative and not to scale.

At point 111, the probe 145 is outside the beam 135, and the intercepted current is very small and can be approximated as zero. At intermediate point 112 the probe has penetrated approximately half way into the beam waist 137, and the intercepted current is about half the total beam current. At point 113, the probe 145 can block the beam completely, and the intercepted beam current I can be equal or very nearly equal to the total beam current, with some possible small correction due to effects such as tails of the beam, or scattering. Two additional intermediate points 114-115 are marked, for which intercept beam current can be about 20% and about 80% of the total beam current. Because the beam spot size at coordinate Zp 149 is similar to the spot size at the beam waist 137, and can be small, the change in transverse coordinate between points 114, 115 can also be small, resulting in a steep beam intercept profile. Any of $\Delta I/\Delta X$, $1/\Delta X$, $\Delta X$, or another measure of steepness can be used to characterize the steepness of graph 110 ($\Delta X$, $\Delta I$ being measured between particular points on graph 110). In some examples, a scan can be performed with predetermined iterations, while in other examples, a scan can be guided to obtain target points on the beam intercept profile, such as at 20% or 80% of the total beam current, or other preselected target points.

FIG. 1B illustrates a configuration having a larger separation between longitudinal coordinates 138, 149 of the beam waist 137 and the probe 145, as compared to FIG. 1A. Graph 170 shows the response of the intercepted beam current I as a function of a transverse coordinate X, with five points 171-175 marked. The insets 181-183 show the configuration of the probe 145 and the beam 136 for the respective points 171-173. Similar to insets 121-123, the insets 181-183 respectively show intercepted currents nearly zero, about half of the total beam current, and nearly all of the total beam current. However, because the probe 145 and the beam waist 137 are farther separated in the Z direction, the spot size traversed by the beam in FIG. 1B is larger than in FIG. 1A, and consequently the transverse separation $\Delta X$ between points 174-175 can be significantly larger than the corresponding transverse separation $\Delta X$ of FIG. 1A.

By evaluating steepness for different longitudinal coordinates of beam waist 137, a longitudinal coordinate L0 having the steepest profile can be found (described further with reference to FIG. 5 herein), and the longitudinal coordinate of the probe can be set equal to L0. With suitable beam quality, the disclosed technology can provide determination of L0 with accuracies within 10 µm, 1 µm, or 0.1 µm.

First Example Method

Figure 2:
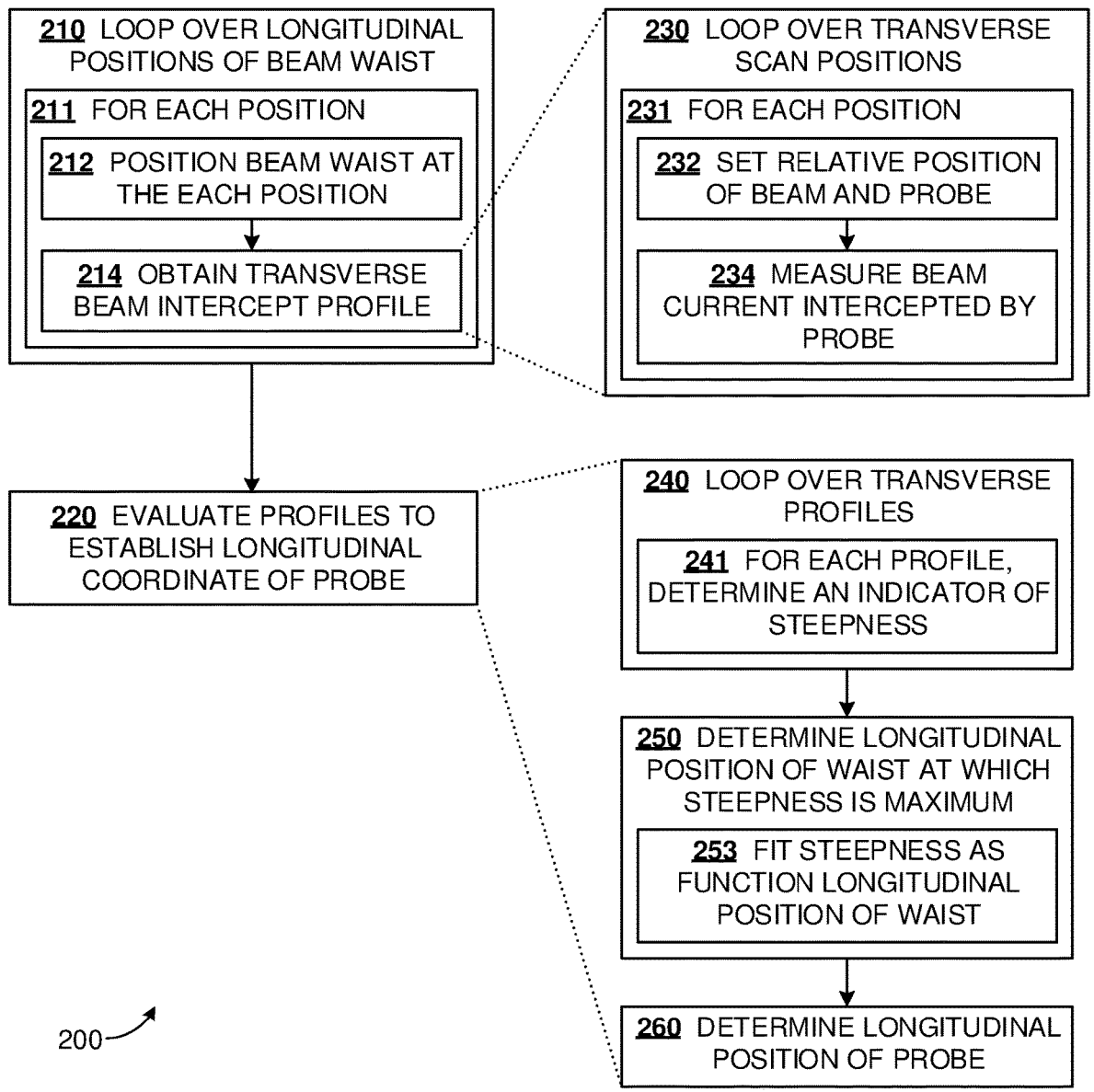
FIG. 2 is a flowchart of an example method according to the disclosed technologies.

FIG. 2 is a flowchart 200 of a first example method according to the disclosed technologies. In this method, transverse beam profiles can be used to determine a longitudinal coordinate of a probe. The transverse beam profiles can result from the probe intercepting a portion of a particle beam over a series of points along a transverse scan.

At process block 210, a loop can be iterated over a sequence of longitudinal positions of a beam waist. Block 211 indicates the operations that can be performed at each iteration of the loop 210. At process block 212, the waist of a particle beam can be positioned at the instant longitudinal position. At process block 214, a transverse beam intercept profile can be obtained with a probe at least partly intercepting the particle beam.

At process block 220, the transverse beam intercept profiles can be evaluated to determine a longitudinal coordinate of the probe. Numerous variations can be used. For example, process block 230 indicates an implementation of process block 214 which can be used in some examples. At process block 230, a loop can be iterated over a sequence of points of a transverse scan between the particle beam and the probe. Block 231 indicates the operations that can be performed at each iteration of the loop 230. At process block 232, the waist of a particle beam can be positioned at the instant transverse position. At process block 234, the beam current intercepted by the probe can be measured. Collectively, the measured beam currents can form the transverse beam intercept profile of block 214.

As another possible variation, process blocks 240, 250 indicate an implementation of process block 220. At process block 240, a loop can be iterated over the transverse beam intercept profiles collected at process block 210. Block 241 indicates that, for each profile, an indicator of steepness can be determined. Then, at process block 250, a longitudinal coordinate of the particle beam waist can be determined at which the steepness is maximum. In some examples, such a determination can be made by fitting a measure of the steepness as a function of the longitudinal position of the beam waist, as shown at process block 253. At process block 260, the longitudinal position of the probe can be determined based on the longitudinal coordinate determined at block 250.

Figure 3:
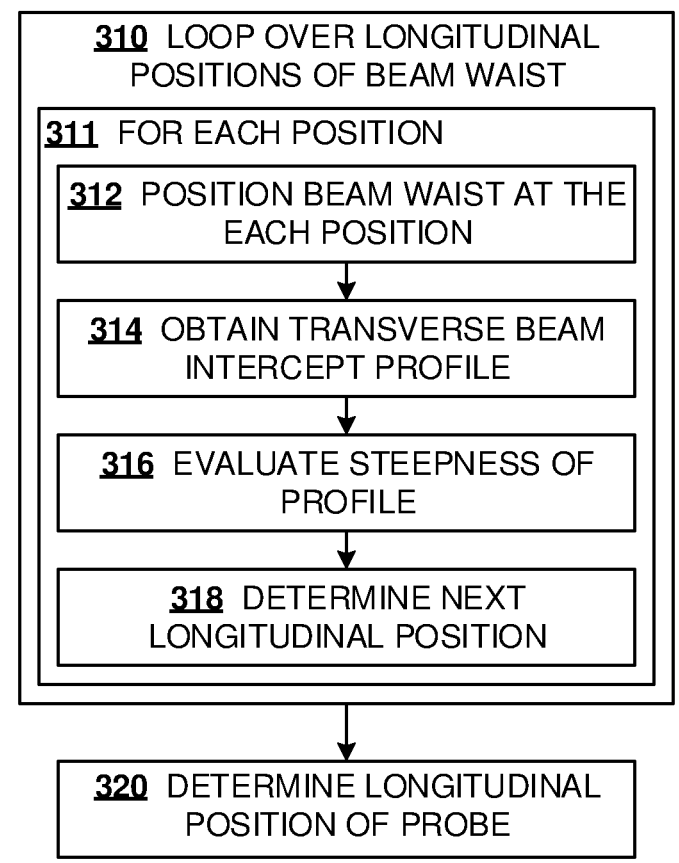
FIG. 3 is a flowchart of a variation of the example method of FIG. 2.

FIG. 3 is a flowchart 300 of yet another variation in which collection and evaluation of transverse beam intercept profiles go hand in hand in an iterative procedure. At process block 310, a loop can be iterated over a sequence of longitudinal positions of a beam waist. Process blocks 311, 312, 314 can function similarly to process blocks 211, 212, 214 described herein.

Then, at process block 316, a steepness of the instant transverse beam intercept profile can be evaluated, similarly to process block 241. At process block 318, the steepness can be used to determine a next longitudinal waist position, for which block 311 can be repeated. When a termination condition is met, loop 310 can terminate, and the longitudinal position of the probe can be determined. In examples, the termination condition can be based on a number of iterations of loop 310, convergence of the longitudinal waist position to within a tolerance, or another condition. In some examples, the longitudinal position of the probe can be determined based on the final longitudinal position of loop 310.

Further variations can also be employed. The method of flowcharts 200 or 300 can be preceded by tuning a cross-sectional pattern of the particle beam, for example, to minimize astigmatism or to minimize waist size. In some examples, this tuning can be performed based on additional transverse beam intercept profiles, as described herein.

In other examples, the method of flowcharts 200 or 300 can be followed by calculating a translation amount for the probe, based on a difference between the probe's longitudinal coordinate and a longitudinal coordinate of a substrate surface. The probe can be translated by this translation amount, and the probe can be brought into contact with the substrate surface.

Second Example Method

Figure 4:
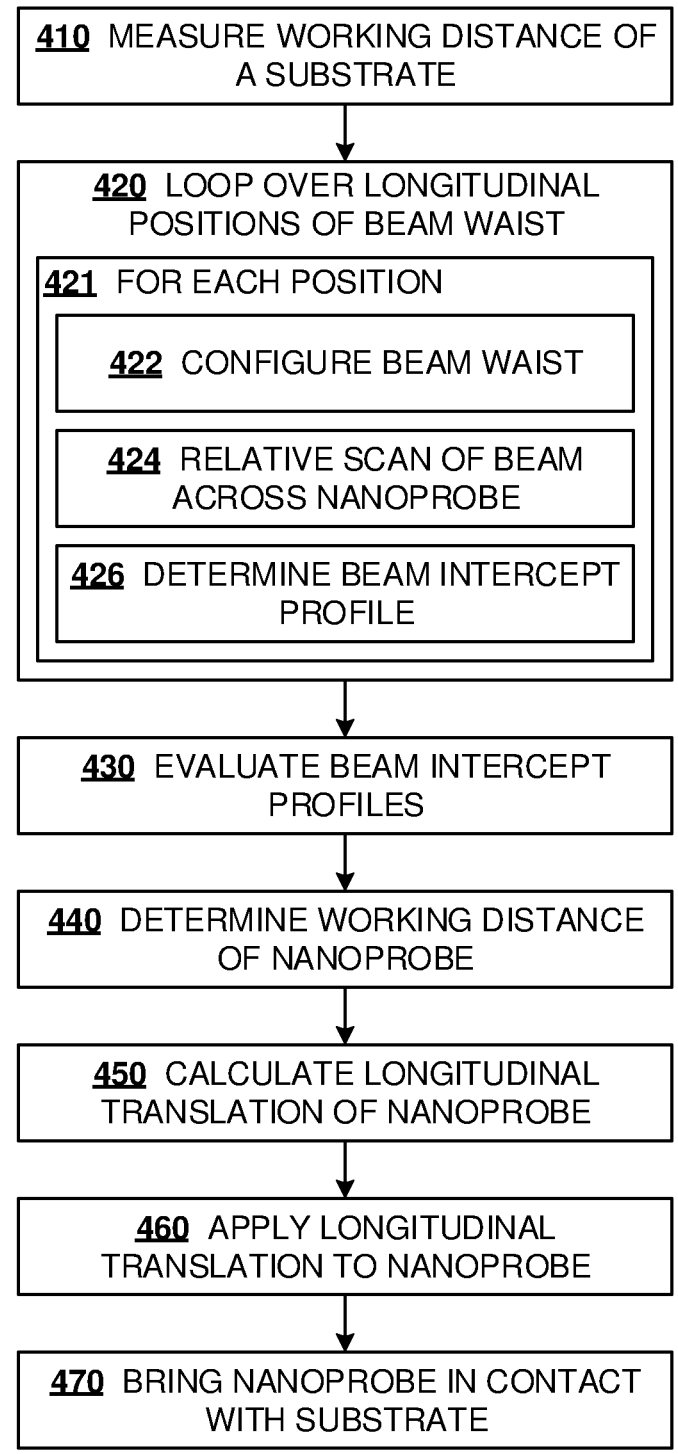
FIG. 4 is a flowchart of an example method according to the disclosed technologies.

FIG. 4 is a flowchart 400 of a second example method according to the disclosed technologies. In this method, the height of a nanoprobe can be determined, using a particle beam, and used to position the nanoprobe on a substrate.

At process block 410, the longitudinal coordinate of a substrate along a longitudinal axis of the particle beam can be determined. This can be accomplished using a focused beam or optical image of the substrate, or by another technique.

At process block 420, a loop is performed over multiple longitudinal positions of a waist of the particle beam. Block 421 indicates operations that can be performed in the loop for each longitudinal position of the beam waist. At process block 422, the waist of the particle beam can be configured to be at the current longitudinal position. Then, at process block 424, a relative transverse scan between the nanoprobe and the beam can be performed. Concurrently, intercepted beam current can be measured to obtain the beam intercept profile as indicated at process block 426. At process block 430, the beam intercept profiles can be evaluated, to obtain the longitudinal coordinate of the nanoprobe at process block 440. In some examples, the evaluation of beam intercept profiles can be done in during the iterations of loop 420, and can be used to guide successive iterations of loop 420, similarly to that described in context of FIG. 3. For example, if successive iterations have passed through a longitudinal beam waist position having maximum steepness (e.g., successive longitudinal waist positions in a first direction had increasing steepness and then decreasing steepness), a next iteration of loop can change the longitudinal waist position opposite to the first direction, and can reduce the longitudinal position step size for subsequent iterations.

With longitudinal coordinates of both the nanoprobe and the underlying substrate known, a longitudinal translation amount (i.e., a distance) for the nanoprobe can be calculated at process block 450. In examples, the translation amount can be the difference of the two longitudinal coordinates, plus or minus a small offset. Offsets can vary between 10 nm to 100 μm, for example, between 20 nm to 1 μm, or between 1 μm to 20 μm. A positive offset can ensure positive contact between the nanoprobe and the substrate, that is, with modest pressure, and can compensate for measurement errors or unevenness of the substrate surface. A negative offset (i.e., an offset subtracted from the difference between longitudinal coordinates) can account for finite size of the nanoprobe in the longitudinal direction. At process block 460, the calculated translation can be applied to the nanoprobe, for example, by control of actuators coupled to the nanoprobe, to bring the nanoprobe into contact with the substrate at block 470. As a variation, all or part of the translation can be applied to the substrate instead of the nanoprobe.

Example Determination of Longitudinal Coordinate of a Probe

Figure 5:
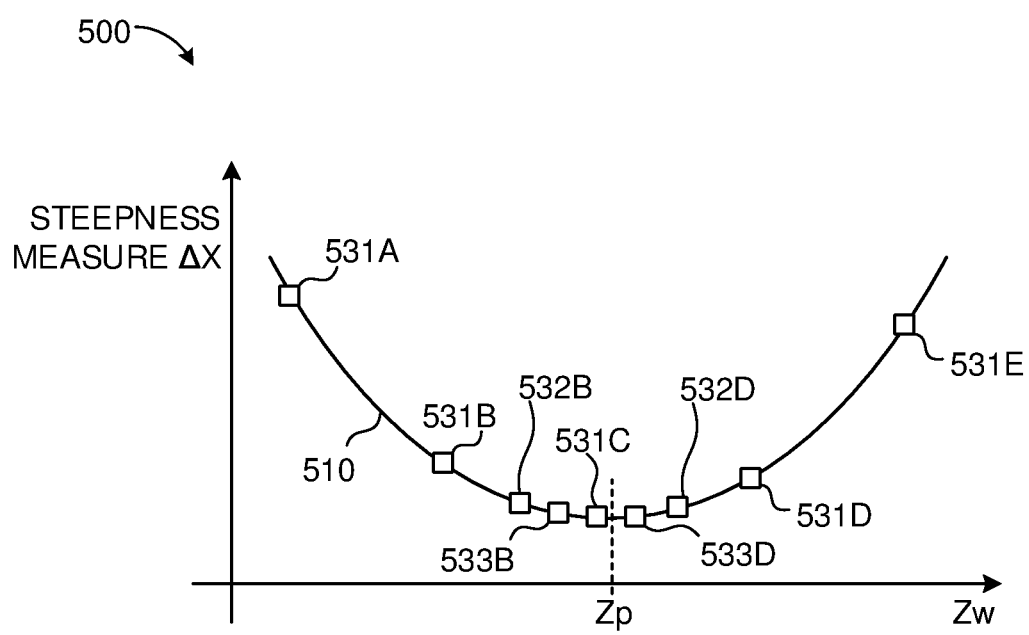
FIG. 5 is a graph illustrating example methods of determining a longitudinal coordinate of a probe according to the disclosed technologies.

FIG. 5 is a graph 500 illustrating example methods of determining a longitudinal coordinate of a probe according to the disclosed technologies. The graph 500 plots ΔX, which can be a steepness measure, as a function of longitudinal position Zw of a beam waist (see also FIG. 6). With ΔX used as a steepness measure, smaller values of ΔX can indicate a steeper profile. That is, maximum steepness corresponds to a minimum on curve 510. Each point 531A-533D of the curve 510 represents a respective transverse scan at the corresponding waist position. Other steepness measures can be used, some associated with an inverted shape compared to curve 510, and requiring a determination of a maximum value of steepness.

In some embodiments, a series of transverse scans can be performed to obtain e.g., the points labeled 531A-531E, and a curve 510 can be fitted to these points using a least squares or other fitting algorithm. The fitted curve 510 can be a polynomial (such as a parabola), a rotated hyperbola, or another function. Polynomial fits can be performed using closed-form matrix calculations; other fits can be evaluated using the Levenberg-Marquardt method or another iterative numerical algorithm. The fitted curve can be used to determine the waist height, at which ΔX is minimum (maximum steepness), and which can be assigned to the longitudinal coordinate of the probe Zp.

In other embodiments, transverse scan points can be obtained by guided iterations. FIG. 5 illustrates one such example using a converging 5-point scan. On a first pass, points 531A-531E can be obtained from respective scans. The positions Zw for points 531A, 531E can be chosen far enough apart to bracket the sought minimum Zp. For example, point 531E can be measured with the waist set to be at or below a height of the substrate. Point 531A can be measured with the waist set near the particle beam source, at a height inaccessible to the probe. Examination of the points 531A-531E shows that, among these points, the steepness factor is minimum at 531C, and that the minimum is bracketed by 531B, 531D. Thus, the next iteration can zoom in on the region 531B-531D. Because 531C has already been evaluated, only points 532B, 532D need to be obtained. Because 531C is still minimum, a third iteration can be performed, adding 533B, 533D between new endpoints 532B, 532D. Eventually a termination condition can be reached, such as the spacing of waist positions Zw between adjacent points 531C, 533D being below a threshold, and the coordinate Zp can be determined as e.g., the measured point having maximum or minimum value of a steepness measure.

Iterative techniques for determining a point of maximum steepness can be combined. In some examples, a single scan sweep can be used to determine a waist position at which steepness is maximum, followed by an iterative search using progressively smaller step sizes. Other techniques and combinations of techniques can also be used.

Example Apparatus

Figure 6:
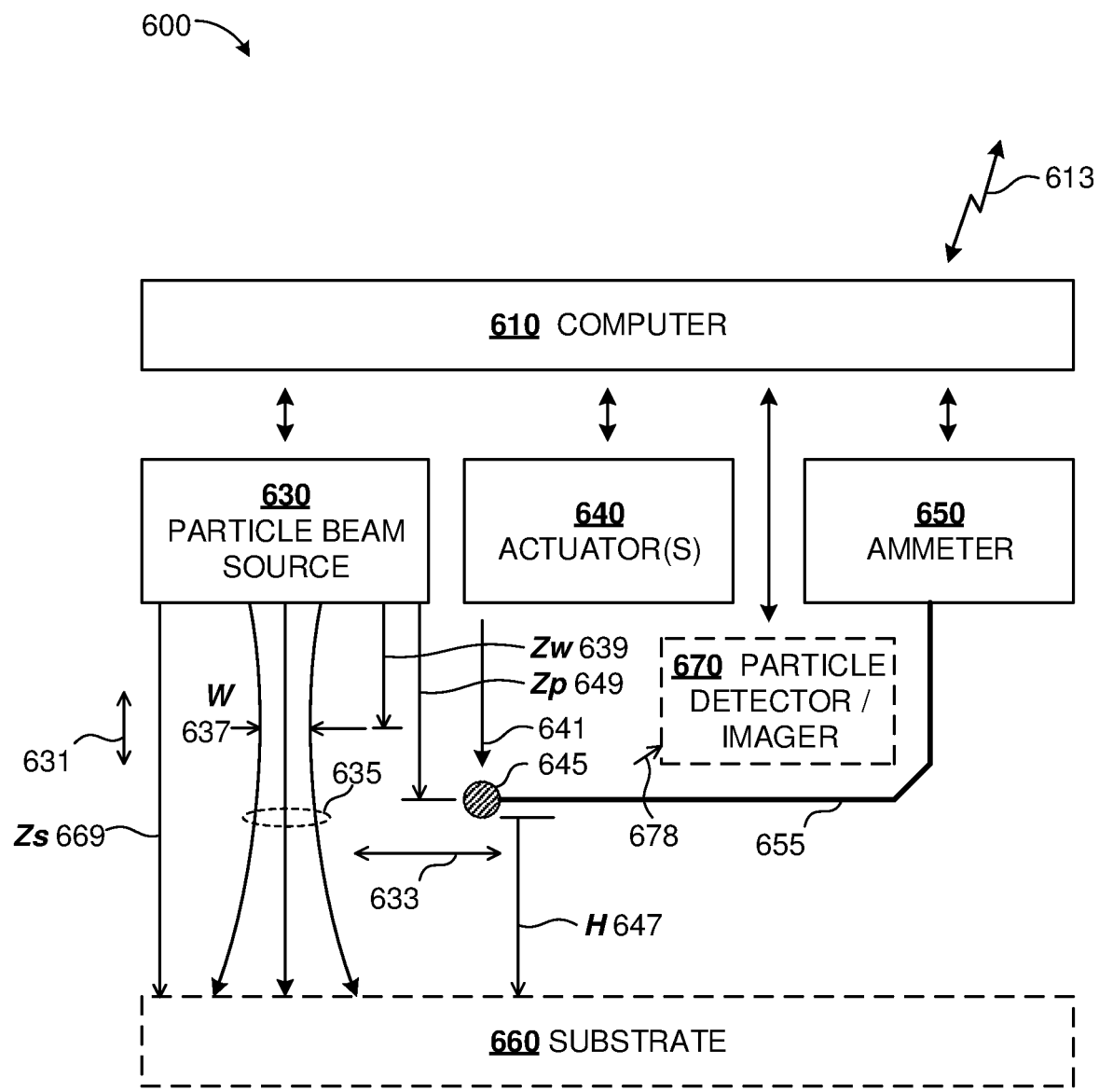
FIG. 6 is diagram of a representative apparatus suitable for practicing some examples of the disclosed technologies.

FIG. 6 is a diagram of an apparatus 600 suitable for practicing some examples of the disclosed technologies. The apparatus 600 can be analytic instrumentation for investigating a substrate 660 and its attendant features or devices. Substrate 660 is generally not part of the apparatus 600, and accordingly is shown by a dashed outline. However, apparatus 600 can include a mount, translation stage, load lock, or other fixturing or handling devices (not shown) to assist in handling the substrate 660.

Apparatus 600 can be controlled by computer 610, which can incorporate one or more hardware or virtual processors as described further herein. Computer 610 can execute instructions stored on computer-readable media to control the apparatus 600 and perform the operations described herein. Computer 610 can have a bus or network connection 613 to peripheral devices (e.g., printer, storage, display) or to other computers (not shown). Apparatus 600 can include the following operational units coupled to the computer 610: a particle beam source 630, one or more actuators 640, and one or more ammeters 650. Also relevant to the disclosed technologies is a probe 645, shown as a cross-section, which can variously be part of apparatus 600, or provided separately. Probe 645 can be a nanoprobe. In some embodiments, multiple probes or nanoprobes can be used, however, for simplicity of illustration, only one probe 645 is depicted in FIG. 6. The actuators 640 can be coupled to adjust the position of the probe 645; a physical connection is schematically represented by arrow 641. The probe 645 can be coupled to the ammeter by an electrical conductor 650, which can be a wire. In some examples, a particle detector 670 (which can be coupled to an imager) can be used to detect backscattered or secondary electrons 678 from probe 645 or from substrate 660, as described further herein.

Particle beam source 630 can be configured to emit a particle beam 635. The particle beam 635 can be a focused beam, converging down to a waist 637 of diameter W as it propagates away from the source 630, and then diverging thereafter. Although the beam 635 is depicted as propagating to the substrate 660, this is not a requirement: in some examples, the substrate may not extend to the transverse position of the beam, or the beam can be intercepted by a separate collector or beam dump (not shown).

The beam waist 637 is at a longitudinal coordinate Zw 639 shown measured from an output port of the beam source 630. Through control of e.g., focusing elements within the beam source 630, the working distance Zw 639 can be adjusted in the longitudinal direction as indicated by arrow 631. Also shown in FIG. 6 are the longitudinal coordinate Zp 649 of the probe 645, and the longitudinal coordinate Zs 669 of the substrate 660.

In some examples, a transverse scan can be performed by moving one or both of particle beam 635 or probe 645, as indicated by arrow 633. Current of the particle beam 635 intercepted by the probe 645 can be directed to the ammeter 650 by wire 655 and measured, and the measured current value can be provided to the computer 610 as part of a transverse beam intercept profile. Where additional probes 645 are used, respective transverse scans and beam profiles can be obtained for each probe 645 or each edge of probe(s) 645. Apparatus 600 can be configured to perform multiple scans and acquire multiple beam intercept profiles, e.g., at multiple heights of waist 637, with multiple probes 645, or multiple configurations of beam 635, and can further evaluate the beam intercept profiles to determine one or more geometric characteristics. A single transverse scan can collect multiple profiles, e.g., of respective probe edges. A geometric characteristic can be determined by fitting the geometric characteristic to parameters derived from transverse beam intercept profiles.

Example Probe Height Determination

In some examples, a single nanoprobe or current collector can be used as probe 645, and the longitudinal coordinate Zp 649 of the probe 645 can be determined from one or more transverse scans at different longitudinal positions W of the beam waist 637, and the height H 647 of the probe 645 above the substrate 660 can be determined. Actuators 640 can be driven to translate the probe 645 by the height H 647 (plus or minus an optional offset) to make contact with the substrate 660.

Example Particle Beam Tuning

In other examples, transverse scans of two probes or probe edges (or, of one probe (edge) at two transverse positions) can be used to determine characteristics of the particle beam 635. These transverse scans can be at a single longitudinal position 639 of the beam waist 637. Both probes (edges) can be at a same longitudinal coordinate Zp 649, which can be the same as the beam waist coordinate 639. The transverse scans of both probes (edges) can be along a common transverse axis and can be performed together in a single scan operation. Edges of the probes can have transverse projections which are orthogonal.

Established characteristics can include a longitudinal coordinate 639 or a diameter of a waist 637 of the particle beam 635. For example, the longitudinal coordinate Zw 639 can be established based on two transverse scans, above and below the waist 637, having complementary profiles. Midway between the two scans, the longitudinal coordinate Zw 639 of the beam waist 637 can be matched to the longitudinal coordinate of the probe Zp 649. Then, with the waist 637 set to probe height (Zw=Zp), the waist diameter W can be minimized by adjusting astigmatism controls of the particle beam source 630. Adjusting the astigmatism controls can be performed by an iterative procedure and can concurrently reduce the beam astigmatism.

Example Apparatus Types

The apparatus 600 can be embodied and used in numerous ways. In some examples, apparatus 600 can incorporate a scanning electron microscope (SEM), particle beam source 630 can be an SEM source, and particle beam 635 can be an electron beam. In other examples, apparatus 600 can be a focused ion beam (FIB) instrument, particle beam source can be a FIB source, and particle beam 635 can be a FIB. Probe 645 can be a nanoprobe, part of a nanoprobe array, another current collector, or an edge thereof.

Example Transverse Scans

Transverse scans can be performed over a plurality of points. The points can be scanned successively in order of transverse position along a scan line, however this is not a requirement. In other examples, the points can be collected out of order, according to a predetermined pattern, or in guided iterations where one or more later scan points are selected and measured based on measurements at one or more earlier scan points. A scan, whether sequential or out-of-order, can be performed at a constant transverse speed or at varying speed. In some examples, the scan speed can be slowed down when the beam is at an edge of a probe for increased dwell time and better signal-to-noise ratio (SNR) at the points of interest. The beam can be swept rapidly in between probe edges or between scan points.

In further examples, a transverse scan can measure one or more points to determine a total current of the beam, and then perform guided iterations to identify specific points (e.g., 20% of total current and 80% of total current) from which a measure of profile steepness can be determined. In varying examples, points can be measured with transverse step sizes in a range from 1 nm to 1 µm, often 10-50 nm, or about 20 nm.

Second Example Application

FIGS. 7A-7D are diagrams illustrating a second application of the disclosed technologies. FIGS. 7A-7D illustrate transverse beam intercept profiles 710, 720, 730, 740 obtained for respective beam characteristics with a fixed configuration of probe edges. FIGS. 7A-7D demonstrate how transverse beam intercept profiles 710, 720, 730, 740 can be used to distinguish among cross-sectional beam patterns 715, 725, 735, 745. Probes 701, 702 are illustrated in top view, i.e., looking along a longitudinal axis of the beam, and are oriented symmetrically at ±45° with respect to a transverse scan path 705 in the X direction. A beam scan across a probe 701, 702 can exhibit a leading edge 723 as the beam begins to be intercepted by the probe, and a trailing edge 724 as the beam moves away from the probe. Generally, the trailing edges 724 and leading edges 723 can be symmetric for a given probe 701, 702. Keeping in mind that the beam cross-sectional dimensions can be around 1-2 orders of magnitude less than the smallest transverse dimension of a probe, the leading edge and trailing edge for a given probe can be widely separated. Thus, to speed up a procedure, one or the other edge can be omitted for each of the probes, that is, the transverse scan can collect points for exactly one edge of each of the two probes 701, 702. Nevertheless, profiles across both probe edges are illustrated in FIGS. 7A-7D for clarity of illustration.

Figure 7A:
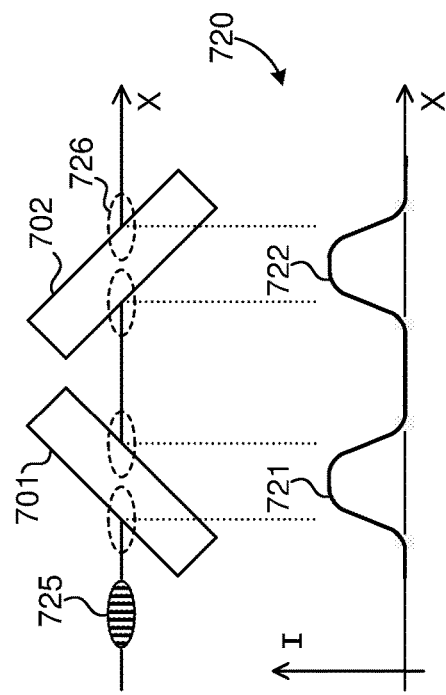
FIGS. 7A-7D are diagrams illustrating an application of the disclosed technologies.
Figure 7B:
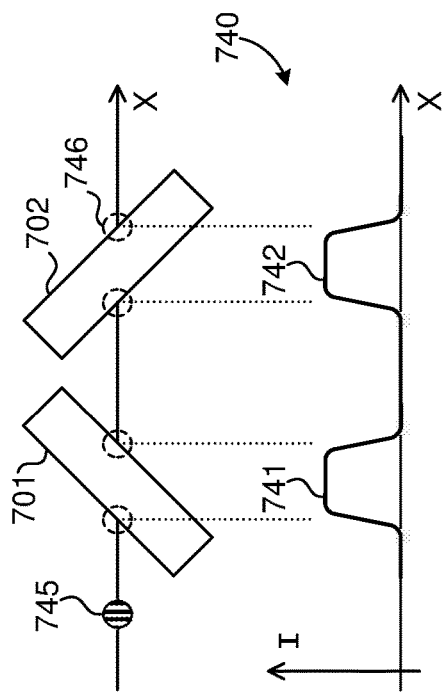
Figure 7C:
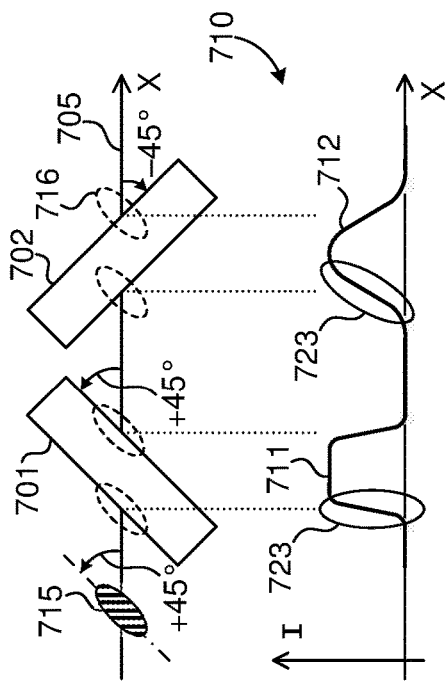
Figure 7D:
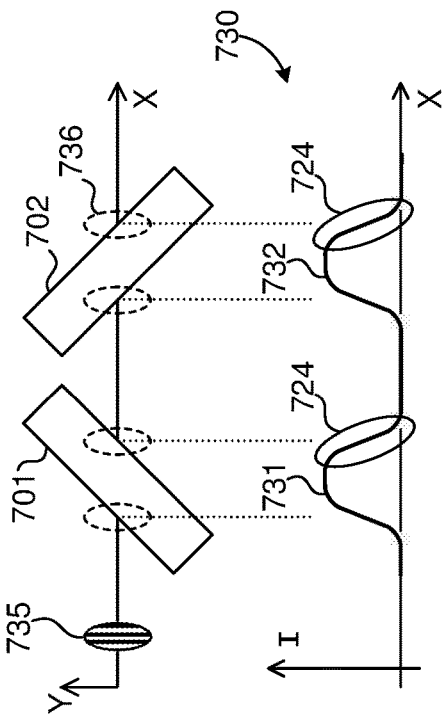

In FIG. 7D, a particle beam having a tight cross-sectional pattern 745 is shown. Because the illustrated beam spot is small and symmetric, the beam current intercept profiles 741, 742 can be steep and substantially similar for both probes 701, 702. However, a spreading of the cross-section in any direction can cause one or the other of the profiles to become less steep.

In FIG. 7A, a beam with an elliptical cross-section 715 is shown, having a major axis parallel to a length direction of probe 701. Inasmuch as the beam cross-sectional extent parallel to the length direction of probe 701 has no impact on the scan profile 711 across probe 701, scan profile 711 has steep leading and trailing edges similar to scan profile 741. However, for probe 702, the top right corner of the beam cross-section (in the plane of the drawing) enters the region of probe 702 at an earlier (advanced) time compared with the scenario of FIG. 7D, while the bottom left corner enters at a later (retarded) time compared with FIG. 7D. Accordingly, the edges of scan profile 712 are broadened and less steep than the edges of profile 742. Thus, a beam having astigmatism in the +45° direction can be distinguished from a tight circular spot. Conversely, a beam having astigmatism in the −45° direction can have a broadened profile for probe 701 and a profile with steep edges for probe 702.

Turning to FIG. 7B, another beam with elliptical cross-section 725 is shown, where the major axis of the ellipse is parallel to the transverse scan direction X. In this case, profiles 721, 722 of both probes 701, 702 can have broadened (less steep) edges. Thus, this beam configuration can be distinguished from both FIGS. 7A, 7D.

FIG. 7C is similar, illustrating a beam with elliptical cross-section 735, with major axis in a Y direction perpendicular to the transverse scan direction X. Again, both profiles 731, 732 can be seen to have broadened edges.

Parameters such as steepness derived from the transverse beam profiles (711 etc.) can be used to distinguish cross-sectional patterns (715 etc.) of a particle beam. In examples, one or more astigmatism parameters or waist size parameters can be determined by fitting to parameters derived from the measured transverse beam intercept profiles.

Example Astigmatic Beam

Figure 8:
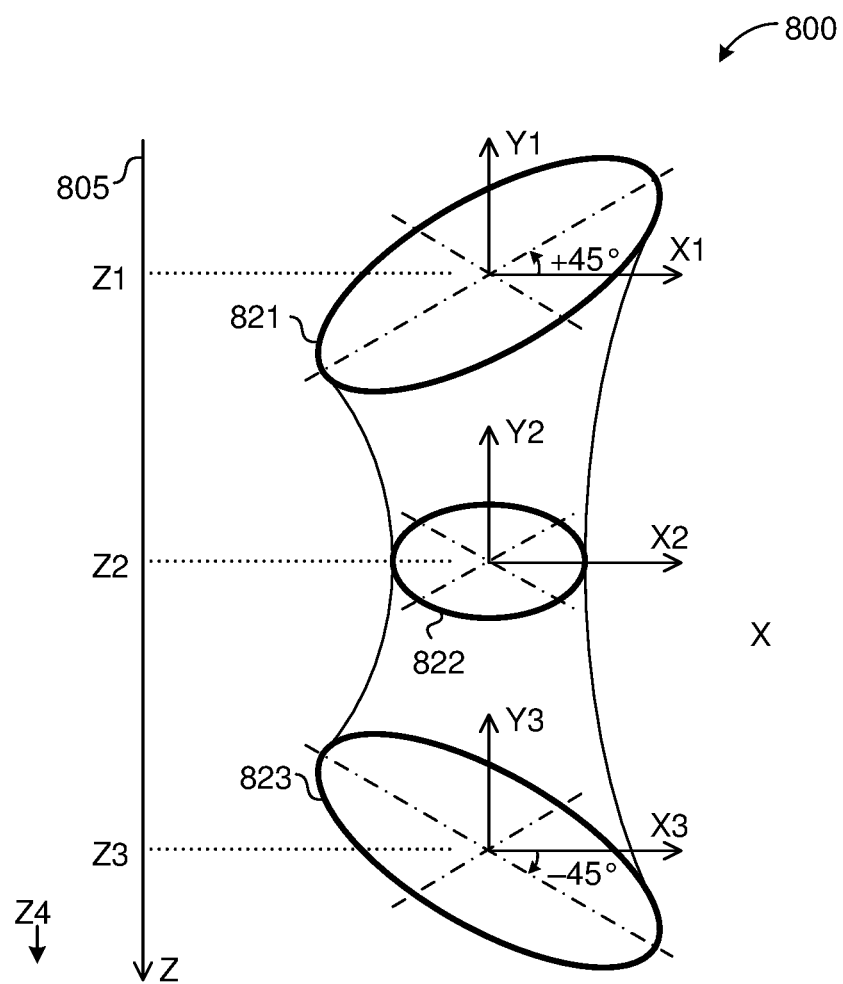
FIG. 8 is an oblique view of an example astigmatic beam.

FIG. 8 is a diagram depicting an example astigmatic beam 800 in an oblique view. FIG. 8 illustrates a principle of operation of some examples of the disclosed technology.

In FIG. 8, the Z axis 805 indicates a longitudinal axis or direction of propagation of the beam. Three cross-sections 821-823 in transverse X-Y planes are illustrated at respective Z coordinates, Z1-Z3. The depicted beam 800 has a circular waist 822, with elongated elliptical cross-sections 821, 823 above and below the waist 822.

At coordinate Z1, the elliptical cross-section 821 has a major axis at an angle of +45° to the X1 axis. At coordinate Z3, the elliptical cross-section 823 has a major axis at an angle −45° to the X3 axis. The axis of elongation of an astigmatic beam can rotate 90° between above the waist and below the waist, and the amount of elongation (i.e., the ellipse eccentricity) can be symmetric above and below the waist. The illustrated elliptical cross-sections 821, 823 at Z1, Z3 are equidistant from the midplane at Z2, and are similar in size and eccentricity, differing only in orientation.

When scanned with an orthogonal probe pair, such as probes 701, 702 of FIG. 7, the profile obtained by probe 701 at height Z1 can be substantially similar to the profile obtained by probe 702 at height Z3, and the profile obtained by probe 702 at height Z1 can be substantially similar to the profile obtained by probe 702 at height Z3. That is, at planes symmetrically disposed above and below the waist height Z2, probes 701, 702 can have complementary beam intercept profiles. If the scanned transverse planes are not symmetric, the complementarity can be lost. For example, at a Z coordinate Z4 farther below Z3 in FIG. 8, the astigmatic cross-section (not shown) can increase its eccentricity while maintain its major axis orientation at −45° with respect to an X axis. The profile measured by probe 701 can be broadened further, while the profile measured by probe 702 can be narrowed further: these profiles can be distinguished from the profiles at Z3 or Z1.

In some examples, transverse scans at different Z positions relative to a waist 822 can be performed by moving the probes up or down along the Z axis, while in other examples, the waist position can be moved by adjusting a focus control of the astigmatic beam 800 to move the waist above and below probes 701, 702. The waist height can be unknown prior to identifying the complementary cross-sections 821, 823.

Once the complementary cross-sections 821, 823 have been identified, the waist 822 and probes can be aligned at a common longitudinal coordinate Z. In a case with a stationary beam 800 and longitudinally translated probes, the probes can be set to a Z coordinate midway between Z1, Z3. In a case with variably focused beam 800 and fixed longitudinal coordinate for the probes, a central value for a focus control can be applied.

The central value can be between first and second value of the focus control corresponding to complementary profiles 821, 823. The central value can be the midpoint between the first and second values, and can include a correction for asymmetry in the focus control. In some examples, the procedure can be repeated to find another set of complementary profiles at Z1', Z3' which are closer than the original pair Z1, Z3, i.e., |Z3'-Z1'|<|Z3-Z1|, to improve the accuracy of determining or setting the waist coordinate.

Third Example Method

Figure 9:
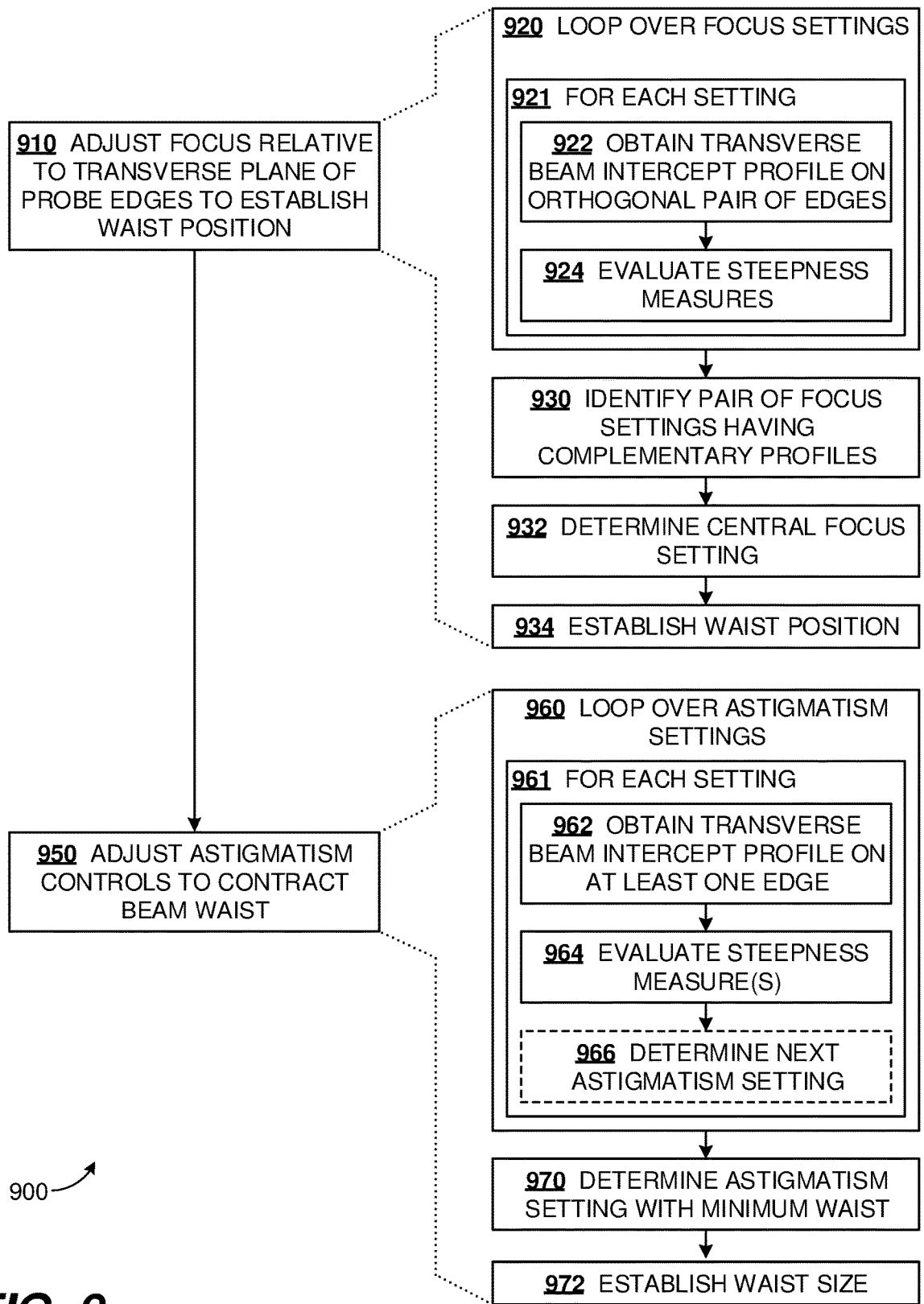
FIG. 9 is a flowchart of an example method according to the disclosed technologies.

FIG. 9 is a flowchart 900 of a third example method according to the disclosed technologies. In this method, transverse beam profiles can be used to tune a beam. The profiles can result from probe edges intercepting a portion of the beam over a series of points along a transverse scan.

At process block 910, the focus of the beam can be adjusted relative to a transverse plane of the probe edges to establish the waist position at the same longitudinal coordinate as the probe edges. At process block 950, astigmatism controls of the beam can be adjusted to contract the waist, i.e., by reducing a size or diameter of the beam waist.

Numerous variations can be used. For example, process blocks 920-934 indicate an implementation of process block 910 which can be used in some examples. At process block 920, a loop can be iterated over a sequence of focus settings. Block 921 indicates operations that can be performed at each iteration of loop 920. At process block 922, a transverse beam intercept profile can be obtained on an orthogonal pair of edges (similar to profile 710). At process block 924, steepness measures can be evaluated for respective probe edges traversed in the profile.

By comparing results from different values of focus settings, a pair of focus settings having complementary profiles can be identified at process block 930. The complementary profiles can have steepness measures for two orthogonal probe edges that are interchanged between the two focus settings. From this pair of focus settings, at process block 932 a central focus setting can be obtained, for which the beam waist will have a same longitudinal coordinate as the probe edges. At process block 934, this central focus setting can be applied, so that the waist position (i.e., longitudinal coordinate) can be established.

Predetermined or guided iterations can be used for loop 920, in any combination. For example, a first set of predetermined iterations can be used to choose a first focus setting, and a second set of guided iterations can be used to locate a second focus setting having profiles complementary to the first focus setting.

As another possible variation, process blocks 960-972 indicate an implementation of process block 950. At process block 960, a loop can be iterated over astigmatism settings. Block 961 indicates operations that can be performed at each astigmatism setting of loop 960. At process block 962, a transverse beam intercept profile can be obtained on at least one probe edge. At process block 964, a steepness measure can be evaluated for each probe edge. In some examples, guided iterations of loop 960 can be used to home in on an astigmatism setting with minimum waist size, and optional block 966 can be used to determine a next astigmatism setting. In other examples, predetermined iterations can be used for loop 960 and block 966 can be omitted. In any event, once loop 960 has completed, the astigmatism setting having minimum waist size can be determined, as indicated at process block 970. By applying this optimal astigmatism setting at process block 972, the minimum waist size can be established.

In some examples, a particle beam can have two astigmatism controls, and the method of blocks 960-972 can be applied successively, alternately, or jointly for the two astigmatism controls.

Fourth Example Method

Figures 10, 11:
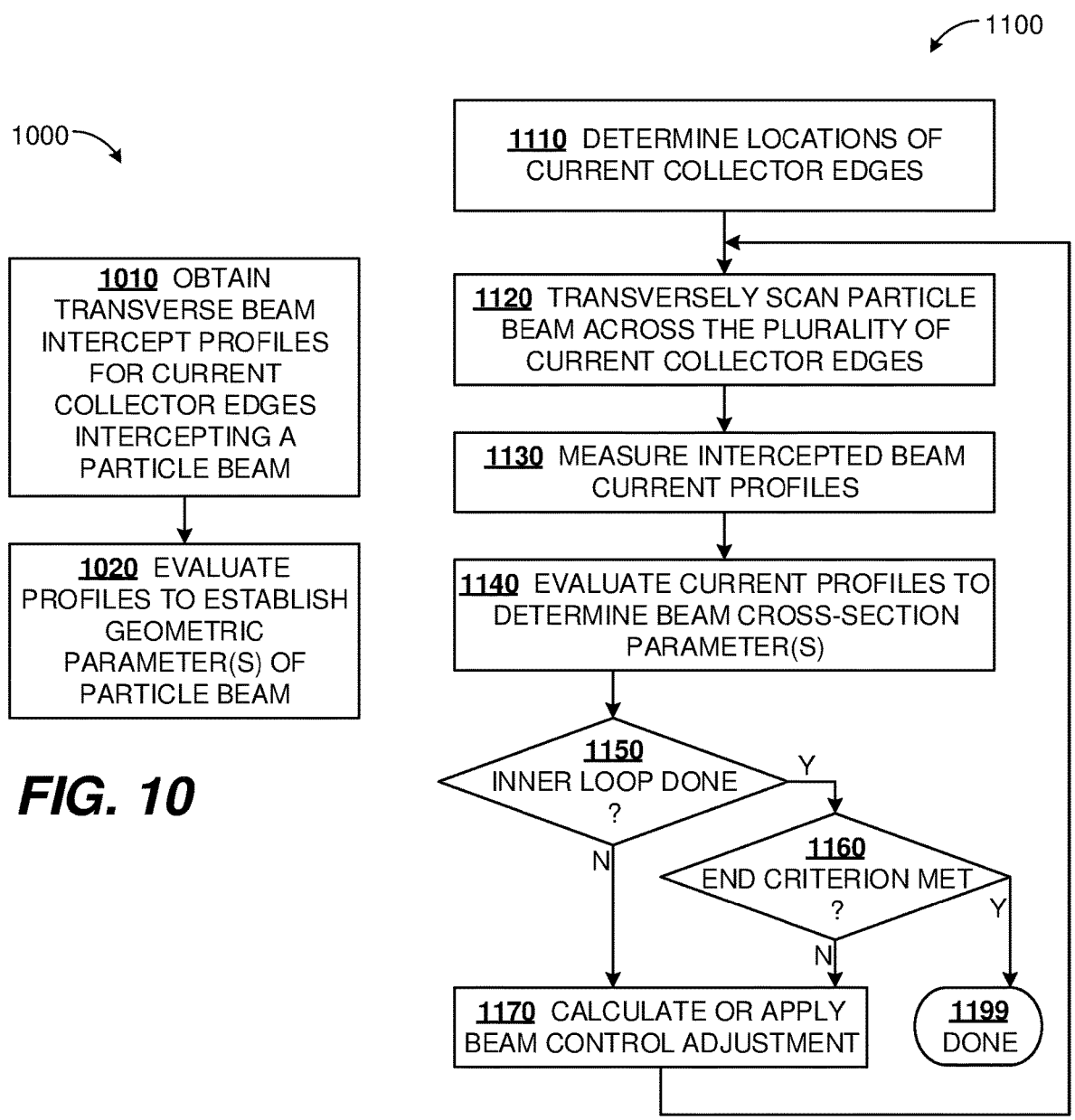
FIG. 10 is a flowchart of an example method according to the disclosed technologies.
FIG. 11 is a flowchart of an example method according to the disclosed technologies.

FIG. 10 is a flowchart 1000 of a fourth example method according to the disclosed technologies. In this method, transverse beam profiles can be used to determine geometric parameters of a particle beam. The transverse beam profiles can result from traversing multiple probe edges, each probe edge intercepting a portion of a particle beam over a series of points along a transverse scan.

At process block 1010, a loop can be iterated over a sequence of current collector edges. The number of current collector edges can commonly be two or four, that is, one or two edges from each of two generally orthogonal current collectors. Two of the current collector edges can have orthogonal transverse projections. At each iteration of the loop in block 1010, respective transverse beam intercept profile for a present current collector edge can be obtained, i.e., a profile of particle beam current intercepted by the present edge. Then, at process block 1020, the profiles from the several edges can be evaluated to determine one or more geometric parameters of the particle beam.

Fifth Example Method

FIG. 11 is a flowchart 1100 of a fifth example method according to the disclosed technologies. The fourth method integrates a method similar to that of flowchart 1000 into a method for automatically tuning a particle beam. The particle beam can be iteratively tuned as geometric parameters of the beam are determined, and corresponding control adjustments to the beam are made. In some examples, a predetermined group of beam settings can be evaluated together to determine a next adjustment.

At process block 1110, the locations of the current collector edges can be determined, which can include determination of edge height, orientation, or reference position in a transverse plane, in any combination. Process blocks 1120, 1130 can be similar to process block 1010 discussed herein. At process block 1120, the particle beam is transversely scanned across the plurality of current collector edges. Concurrently, at process block 1130, transverse profiles of intercepted beam current can be measured. Each profile can be obtained by measuring current of the particle beam intercepted by a present current collector edge at a sequence of transverse scan positions of the particle beam relative to the present current collector edge. Alternatively, a proxy for intercepted current can be used, as described further herein. At process block 1140, the current profiles of process block 1130 can be analyzed to determine one or more steepness measures, which are indicative of beam cross-section parameters, as described for example in the context of FIG. 7 herein.

In some examples, the set of profiles described above for process blocks 1130, 1140 can be repeated for a predetermined set of beam configurations. For example, with respect to a particular beam configuration control V, process blocks 1120, 1130, 1140 can be performed thrice, at V={V1, V2, V3}. A control V such as a beam focus control or a beam astigmatism control can be used. Other preconfigured sets of configurations can be used, covering one, two, three, or more configuration controls for the particle beam. In such examples, such a set of configurations can be regarded as an inner loop. While in such an inner loop, decision block 1150 ("Inner loop done?") can evaluate to "no" and the method can proceed via the N branch of decision block 1150 to block 1170, where a beam control adjustment is applied to reach another predetermined configuration. To illustrate if the first iteration of the inner loop was for a particular configuration parameter at V1, the parameter can be adjusted to V2, and then V3 at successive iterations of process block 1170. After, the method can return to process block 1120 for further scanning, profile gathering, and evaluation of beam parameters.

In other examples, no inner loop is used, and each pass through process blocks 1120, 1130, 1140, leads to a new calculation of beam configuration parameters to obtain a "better" beam, e.g., one having lower astigmatism or a narrower waist. In such examples, or when the abovementioned inner loop completes, the method follows the Y branch from decision block 1150 to decision block 1160, where a termination condition can be tested. An example of a termination condition can be determination of a second focus setting having complementary profiles to a previously selected first focus setting. Another example of a termination condition can be determination of an astigmatism setting having minimum beam waist size. Such determinations can be to within predetermined tolerances.

If the termination condition has not been met, the method can proceed to block 1170, where a control adjustment for a new beam configuration can be determined and applied, following which the method can revert to process block 1120 to reevaluate the beam cross-section parameters with a new set of beam profiles at the new beam configuration. The selection of the new beam configuration at process block 970 can be based on a steepest descent or other optimization method. Other techniques, such as simulated annealing, can also be used.

If the termination condition has been met at block 1170, the tuning process (or a stage of the tuning process) can be complete, and the method can proceed via the Y branch from block 1170 to stop block 1199. A range of termination conditions can be used, including (i) a preset number of passes through the blocks 1120, 1130, 1140, (ii) beam quality parameters that meet or exceed desired beam quality parameters (e.g., less than a threshold waist size, or less than a threshold amount of astigmatism), or (iii) a change in beam quality parameters that is less than a threshold value over the last N passes through blocks 1120, 1130, 1140, e.g., change in waist size less than 2% over the last four passes, or change in astigmatism less than 0.02 between last two passes. N can be any integer greater than or equal to 2, such as 2, 3, 4, 5, or so forth. Some or all of flowchart 1100 (e.g., the loop from 1120 through 1160 and 1170) can be repeated until the desired beam quality has been achieved or some other termination condition has been met. Some or all of flowchart 1100 can be repeated for successive tuning stages, such as a first stage for establishing the waist height at a transverse plane of the probe edges, by adjusting a beam focus control, followed by a second stage for establishing the waist diameter, by adjusting one or more beam astigmatism controls.

For sensitivity of the tuning procedure or ease of decoupling measurements or beam control adjustments, it can be desirable to use a pair of transverse scan profiles across a pair of orthogonal current collector edges, however this is not a requirement. In other examples, other sets of transverse beam intercept profiles can be used, such as 360°/N orientation steps with N probes, or two probes at a non-orthogonal angle such as 45° or 60°. In further examples, a single probe edge can be used, with the probe edge being rotated between transverse scans to emulate multiple probe edges. In additional examples, instead of discrete probes, a dedicated stencil can be used having an array of current collector edges formed thereon at desired angles.

Many variations are possible. In some examples, a transverse scan can be performed with the waist of the particle beam and a current collector edge positioned at the same longitudinal coordinate, to within a tolerance. The tolerance can be in a range 0.1 mm to 1 cm, for example 1 mm. Positions of the current collector edge or the waist of the particle beam can be adjusted to match their longitudinal coordinates. Transverse scans of the fourth method can be performed with uniform or varying speeds as described herein.

The analysis or evaluation of process block 1140 can include determining an indicator of steepness corresponding to a portion of a particle beam intercepted by a given current collector edge as a function of transverse coordinate. Process block 1140 can include compensating for differences in longitudinal position of the current collector edges.

In some examples, the fourth method can be performed with a single current collector edge, for example by changing the orientation of the edge and the scan direction between transverse scans.

Variations for Measuring Beam Profiles

In some examples, beam intercept profiles have been described in terms of a current of beam particles intercepted by a probe being measured by an ammeter. However, this is not a requirement. Alternative techniques can be used to provide equivalent beam intercept profiles, some of which are disclosed herein.

Complementary Measurement of Substrate Current

Current from the substrate can be measured instead of measuring probe current directly. The substrate current can be complementary to the probe current, as probe current plus substrate current can equal total particle beam current, which can be constant. Thus, the steepness of the substrate current can be the same as the steepness of the probe current, and the substrate current profile can be used directly to evaluate an indicator of steepness. Alternatively, the substrate current can be subtracted from total particle beam current to infer the probe current.

Measurement of Secondary or Backscatter Particles

A particle beam impinging on a target can generate secondary or backscatter particles. Backscatter particles can be regarded as same as the impinging beam particles, after one or more elastic scattering events within the target. Secondary particles can be regarded as particles generated within the target by an atomic or electromagnetic process as a result of the impinging beam. The secondary particles can be of a same type or a different type as the beam particles. For example, in an SEM, the beam particles and the secondary particles can both be electrons. Alternatively, the secondary particles can be e.g. X-ray photons. In a FIB machine, the beam particles can be ions, and the secondary particles can be electrons or photons.

Some particle beam equipment has integrated detectors for measuring secondary or backscatter particles, often for imaging. (Such a detector, with an optional imager, 670 is shown in FIG. 6, for detecting secondary or backscatter particles 678.) By shielding such detectors from the substrate, secondary or backscatter particles just from the probe can be measured, as the probe and particle beam are scanned transversely relative to one another. These measurements can be used to obtain a beam intercept profile. Alternatively, detectors can be shielded from the probe, and complementary measurements of secondary or backscatter particles just from the substrate can be made. These complementary substrate measurements can also be used to obtain a beam intercept profile.

Direct Measurement from an Imaging Detector

In some examples, the detector intensity (e.g. current of detected secondary or backscatter particles) can be measured directly to obtain a beam intercept profile, as described above. In such examples, the spatial resolution of the beam intercept profile can be comparable to the separation between neighboring points of a transverse scan.

Measurement with an Imaging Subsystem

In other examples, the detector can be coupled to an imaging subsystem, and the beam profile can be determined from pixel intensities determined by the imaging subsystem. That is, pixel intensities of an image, e.g. one or more transverse rows of an imaging scan, can be used to obtain a beam intercept profile. A complete 2-D image is not required: pixel values can be determined for a single row of pixels, or a few rows, such as 2-5 rows. Further, the beam need not be focused at the probe or substrate; often an unfocused or defocused beam can be used. In these examples, the transverse spatial resolution can be determined by the imaged pixel size. For example, with 884 pixels along a 1 μm field of view, pixel resolution can be about 1 nm. In some examples, this resolution can be sufficient, e.g. when the longitudinal coordinate of the probe is far from the beam waist. In other examples, the resolution can be improved (on the order of 0.1 nm or better) by reducing the field of view.

A Generalized Computer Environment

Figure 12:
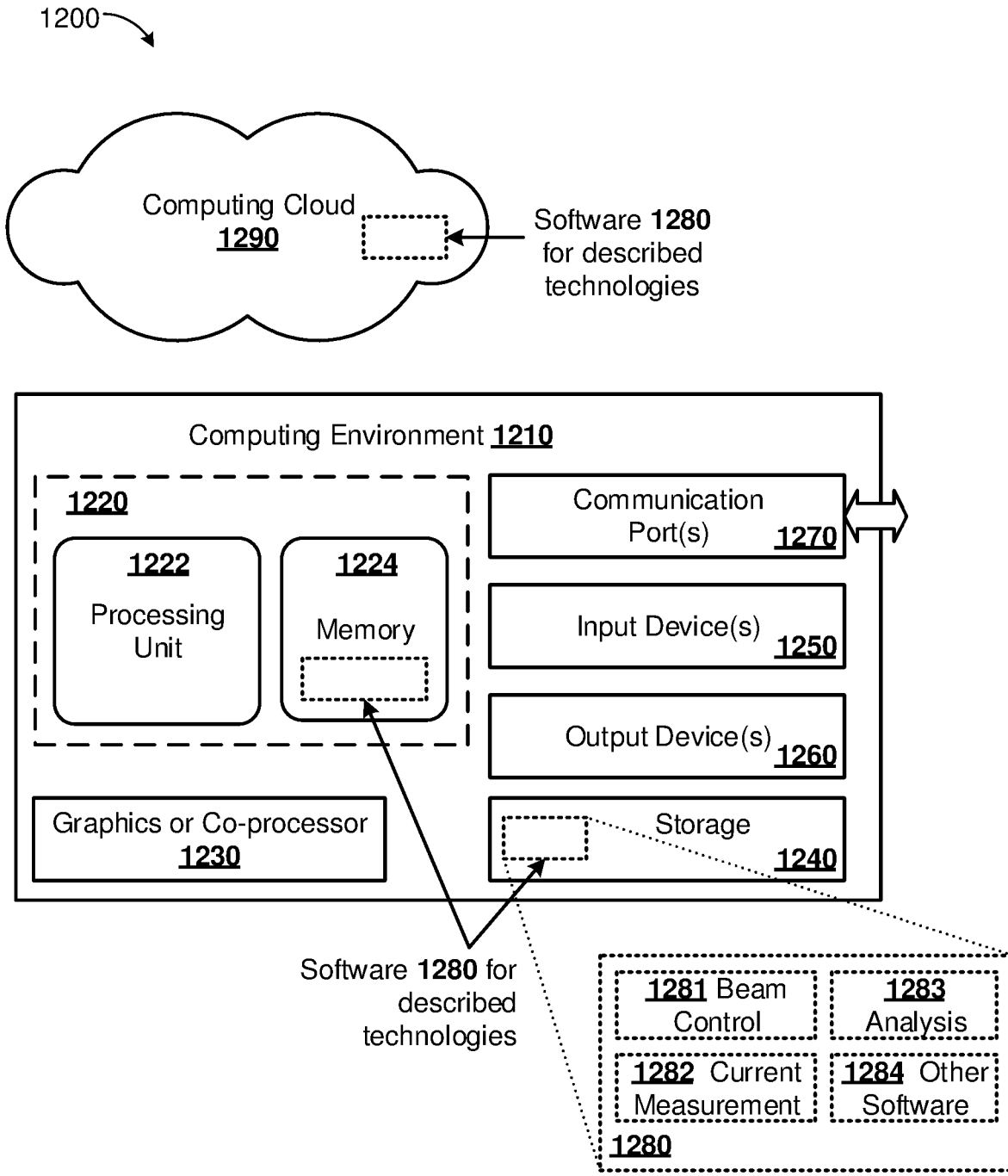
FIG. 12 illustrates a generalized example of a suitable computing environment in which described embodiments, techniques, and technologies can be implemented.

FIG. 12 illustrates a generalized example of a suitable computing system 1200 in which described examples, techniques, and technologies can be implemented for configuration of analytic equipment using transverse beam intercept profiles. The computing system 1200 is not intended to suggest any limitation as to scope of use or functionality of the present disclosure, as the innovations can be implemented in diverse general-purpose or special-purpose computing systems. The computing system 1200 can control one or more particle beam sources, actuators, ammeters, SEM machines, FIB machines, nanoprobe test systems, other analytic equipment, or components thereof; or can acquire, process, output, or store measurement data.

With reference to FIG. 12, computing environment 1210 includes one or more processing units 1222 and memory 1224. In FIG. 12, this basic configuration 1220 is included within a dashed line. Processing unit 1222 can execute computer-executable instructions, such as for control or data acquisition as described herein. Processing unit 1222 can be a general-purpose central processing unit (CPU), a processor in an application-specific integrated circuit (ASIC), or any other type of processor. In a multi-processing system, multiple processing units execute computer-executable instructions to increase processing power. Computing environment 1210 can also include a graphics processing unit or co-processing unit 1230. Tangible memory 1224 can be volatile memory (e.g., registers, cache, or RAM), non-volatile memory (e.g., ROM, EEPROM, or flash memory), or some combination thereof, accessible by processing units 1222, 1230. The memory 1224 stores software 1280 implementing one or more innovations described herein, in the form of computer-executable instructions suitable for execution by the processing unit(s) 1222, 1230. For example, software 1280 can include software 1281 for controlling a particle beam, software 1282 for controlling current measurements, software 1283 for analysis, or other software 1284. The inset shown for software 1280 in storage 1240 can be equally applicable to software 1280 elsewhere in FIG. 12. The memory 1224 can also store control parameters, calibration data, measurement data, or database data. The memory 1224 can also store configuration and operational data.

A computing system 1210 can have additional features, such as one or more of storage 1240, input devices 1250, output devices 1260, or communication ports 1270. An interconnection mechanism (not shown) such as a bus, controller, or network interconnects the components of the computing environment 1210. Typically, operating system software (not shown) provides an operating environment for other software executing in the computing environment 1210, and coordinates activities of the components of the computing environment 1210.

The tangible storage 1240 can be removable or non-removable, and includes magnetic disks, magnetic tapes or cassettes, CD-ROMs, DVDs, or any other medium which can be used to store information in a non-transitory way and which can be accessed within the computing environment 1210. The storage 1240 stores instructions of the software 1280 (including instructions and/or data) implementing one or more innovations described herein. Storage 1240 can also store image data, measurement data, reference data, calibration data, configuration data, or other databases or data structures described herein.

The input device(s) 1250 can be a mechanical, touch-sensing, or proximity-sensing input device such as a switch, pushbutton, keyboard, mouse, pen, touchscreen, or trackball, a voice input device, a scanning device, or another device that provides input to the computing environment 1210. The output device(s) 1260 can be a display, printer, speaker, optical disk writer, digital-to-analog converter, actuator, or another device that provides output from the computing environment 1210. Input or output can also be communicated to or from a remote device over a network connection, via communication port(s) 1270.

The communication port(s) 1270 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1210, either as an input device 1250 or coupled to a communication port 1270, and can include analog-to-digital converters or connections to an instrumentation bus. An instrumentation control system can be integrated into computing environment 1210, either as an output device 1260 or coupled to a communication port 1270, and can include digital-to-analog converters, switches, or connections to an instrumentation bus.

In some examples, computer system 1200 can also include a computing cloud 1290 in which instructions implementing all or a portion of the disclosed technology are executed. Any combination of memory 1224, storage 1240, and computing cloud 1290 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein. Virtual processors, virtual hardware, and virtualized devices are ultimately embodied in a hardware processor or another form of physical computer hardware, and thus include both software associated with virtualization and underlying hardware.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "acquire," "actuate," "adjust," "analyze," "apply," "calculate," "collect," "configure," "determine," "dwell," "evaluate," "emit," "focus," "intercept," "iterate," "measure," "move," "obtain," "position," "produce," "provide," "scan," "search," "transit," "translate," or "tune," to describe the disclosed methods. These terms are high-level abstractions of the actual operations that can be performed by or controlled by a computer system. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding, and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 12, computer-readable storage media include memory 1224, and storage 1240. The term computer-readable storage media does not include signals and carrier waves. In addition, the term computer-readable storage media does not include communication ports (e.g., 1270).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer), on an embedded computer (e.g., a microprocessor, microcontroller, or specialized computing circuitry), or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, B#, C, C++, C#, Curl, Dart, Fortran, Java, JavaScript, Julia, Lisp, Matlab, Octave, Perl, Python, Qt, R, Ruby, Rust, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

The disclosed methods can also be implemented by specialized computing hardware that is configured to perform any of the disclosed methods. For example, the disclosed methods can be implemented by an integrated circuit (e.g., an application specific integrated circuit (ASIC) or programmable logic device (PLD), such as a field programmable gate array (FPGA)). The integrated circuit or specialized computing hardware can be embedded in or directly coupled to a battery controller or another computing device.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
a particle beam source configured to emit a particle beam;
computer-readable media storing instructions; and
one or more hardware processors with memory coupled thereto, the one or more hardware processors further coupled to the particle beam source and the computer-readable media;
wherein the instructions, when executed by the one or more hardware processors, cause the one or more hardware processors to perform operations comprising:
obtaining a plurality of transverse profiles of particle beam intensity at one or more longitudinal positions of a waist of the particle beam; and
evaluating the plurality of transverse profiles to establish a geometric characteristic.

2. The apparatus of claim 1, wherein the obtaining a given one of the transverse profiles comprises measuring current of the particle beam intercepted by a current collector at a plurality of points of a transverse scan of the particle beam relative to the current collector or of the current collector relative to the particle beam.

3. The apparatus of claim 2, wherein the current collector is a nanoprobe.

4. The apparatus of claim 1, wherein the obtaining a given one of the transverse profiles comprises measuring intensities of secondary or backscattered particles at a plurality of points of a transverse scan of the particle beam relative to a probe or of the probe relative to the particle beam.

5. The apparatus of claim 1, wherein the obtaining a given one of the transverse profiles comprises determining, by an imaging subsystem, pixel intensities along a transverse scan of the particle beam relative to a probe.

6. The apparatus of claim 1, wherein the geometric characteristic is a longitudinal coordinate of a probe.

7. The apparatus of claim 6, wherein the probe is a nanoprobe, and further comprising:
an actuator coupled to the nanoprobe;
wherein the operations further comprise:
determining a longitudinal translation of the nanoprobe based on a difference between the longitudinal coordinate of the nanoprobe and a longitudinal coordinate of a substrate surface; and
controlling the actuator to place the nanoprobe in contact with the substrate surface based on the determined longitudinal translation.

8. The apparatus of claim 1, wherein the geometric characteristic is a longitudinal coordinate of the waist of the particle beam.

9. The apparatus of claim 8, wherein first and second profiles of the plurality of transverse profiles respectively comprise transverse scan points of the particle beam relative to first and second probe edges or of the first and second probe edges relative to the particle beam, wherein the first and second probe edges have orthogonal transverse projections.

10. The apparatus of claim 9, wherein the first and second profiles are obtained in a single transverse scan, and a scan speed of the single transverse scan is faster when the particle beam is at one of the two probe edges than when the particle beam is between the two probe edges.

11. The apparatus of claim 9, wherein the operations further comprise:
executing a control adjustment on the particle beam to reduce an astigmatism or a waist size of the particle beam.

12. The apparatus of claim 1, wherein the apparatus is a scanning electron microscope.

13. The apparatus of claim 1, wherein the particle beam is a focused ion beam.

14. A method comprising:
obtaining a plurality of transverse beam intercept profiles for respective longitudinal positions of a waist of a particle beam, each of the transverse beam intercept profiles obtained with a probe at least partly intercepting the particle beam; and
evaluating the transverse beam intercept profiles to determine a longitudinal coordinate of the probe.

15. The method of claim 14, wherein the obtaining comprises measuring current of the particle beam intercepted by the probe at a plurality of points of a transverse scan of the particle beam relative to the probe.

16. The method of claim 14, wherein the evaluating further comprises:
determining an indicator of steepness, for each of the transverse beam intercept profiles;
determining a first longitudinal coordinate of the waist of the particle beam, at which the steepness is a maximum, by fitting a measure of the steepness as a function of the respective longitudinal positions of the waist of the particle beam; and
determining the longitudinal coordinate of the probe based on the first longitudinal coordinate.

17. The method of claim 14, wherein the evaluating further comprises:
determining an indicator of steepness, for each of the transverse beam intercept profiles;
determining a first longitudinal coordinate of the waist of the particle beam, at which the steepness is a maximum, by iterating the longitudinal positions of the waist of the particle beam until a convergence criterion is met; and
determining the longitudinal coordinate of the probe based on the first longitudinal coordinate of the waist of the particle beam.

18. The method of claim 14, wherein the transverse beam intercept profiles are first transverse beam intercept profiles, and further comprising:
tuning a cross-sectional pattern of the particle beam prior to the obtaining, based on a plurality of second transverse beam intercept profiles.

19. The method of claim 14, further comprising:
determining an amount of longitudinal translation for the probe from a difference between the longitudinal coordinate of the probe and a longitudinal coordinate of a substrate surface; and
causing the probe to be longitudinally translated by the determined amount.

20. The method of claim 19, wherein:
the obtaining comprises measuring current of the particle beam intercepted by the probe at a plurality of points of a transverse scan of the particle beam relative to the probe;
the evaluating comprises:
determining an indicator of steepness, for each of the transverse beam intercept profiles, corresponding to a portion of the particle beam intercepted by the probe as a function of a transverse coordinate;
determining a first longitudinal coordinate of the waist of the particle beam at which the steepness is a maximum; and
determining the longitudinal coordinate of the probe based on the first longitudinal coordinate;
the particle beam is an electron beam of a scanning electron microscope; and
the probe is a nanoprobe.

21. One or more computer-readable storage media storing instructions which, when executed by one or more hardware processors, cause the one or more hardware processors to perform the method of claim 14.

22. A method comprising:
obtaining a plurality of transverse beam intercept profiles for respective probe edges having distinct orientations, each of the profiles with the respective probe edge at least partly intercepting a particle beam; and
evaluating the transverse beam intercept profiles to establish one or more geometric parameters of the particle beam.

23. The method of claim 22, wherein the obtaining comprises measuring current of the particle beam intercepted by a given one of the probe edges at a plurality of positions of a transverse scan of the particle beam relative to the given probe edge.

24. The method of claim 22, wherein the one or more geometric parameters comprise a longitudinal coordinate of a waist of the particle beam, wherein the establishing the longitudinal coordinate comprises setting the longitudinal coordinate at a transverse plane of the probe edges and wherein the method further comprises:

adjusting one or more astigmatism controls to contract the waist of the particle beam.

25. The method of claim 22, wherein two of the probe edges have orthogonal transverse projections, and the evaluating comprises:
identifying first and second values of a focus control of the particle beam at which the transverse beam intercept profiles of the two probe edges are complementary.

26. The method of claim 25, wherein:
the obtaining comprises measuring current of the particle beam intercepted by a given one of the two probe edges at a plurality of positions of a transverse scan of the particle beam relative to the given probe edge;
the particle beam is an electron beam of a scanning electron microscope and has a waist;
the two probe edges are edges of one or more nanoprobes;
the plurality of positions are disposed in a straight line;
the one or more geometric parameters include a longitudinal coordinate of the waist and a diameter of the waist;
and the method further comprises:
determining a central value between the first and second values;
establishing the longitudinal coordinate of the waist at a transverse plane of the two probe edges by setting the focus control to the central value; and
iterating over settings of one or more astigmatism controls of the particle beam to minimize the diameter of the waist.

27. One or more computer-readable storage media storing instructions which, when executed by one or more hardware processors, cause the one or more hardware processors to perform the method of claim 22.

* * * * *